(12) United States Patent
Tanaka et al.

(10) Patent No.: US 7,419,861 B2
(45) Date of Patent: Sep. 2, 2008

(54) LASER IRRADIATION APPARATUS, LASER IRRADIATION METHOD, SEMICONDUCTOR DEVICE, AND METHOD OF MANUFACTURING A SEMICONDUCTOR DEVICE

(75) Inventors: Koichiro Tanaka, Kanagawa (JP); Shunpei Yamazaki, Tokyo (JP); Ritsuko Kawasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 277 days.

(21) Appl. No.: 11/158,453

(22) Filed: Jun. 22, 2005

(65) Prior Publication Data
US 2005/0247685 A1 Nov. 10, 2005

Related U.S. Application Data

(62) Division of application No. 09/610,637, filed on Jul. 5, 2000, now Pat. No. 6,927,109.

(30) Foreign Application Priority Data

| Jul. 5, 1999 | (JP) | .................................. 11-191054 |
| Jul. 12, 1999 | (JP) | .................................. 11-198249 |
| Sep. 30, 1999 | (JP) | .................................. 11-277975 |

(51) Int. Cl.
*H01L 21/00* (2006.01)
(52) U.S. Cl. ......................... 438/166; 438/308; 438/795
(58) Field of Classification Search .......... 438/149.166, 438/487, 795
See application file for complete search history.

(56) References Cited

U.S. PATENT DOCUMENTS

| 4,020,319 A | 4/1977 | Shepard et al. ............. 219/121 |
| 4,069,080 A | 1/1978 | Osborne ..................... 156/272 |
| 4,234,356 A | 11/1980 | Auston et al. ................ 148/1.5 |

(Continued)

FOREIGN PATENT DOCUMENTS

JP             09-186336            7/1997

(Continued)

OTHER PUBLICATIONS

Im, J.S. et al, "Phase Transformation Mechanisms Involved in Excimer Laser Recrystallization of Amorphous Silicon Films," Applied Physics Letters, vol. 63, No. 14, pp. 3-5, Oct. 4, 1993.

(Continued)

*Primary Examiner*—Brook Kebede
*Assistant Examiner*—Phillip S Green
(74) *Attorney, Agent, or Firm*—Cook Alex Ltd.

(57) ABSTRACT

To form a polycrystalline silicon film having a grain size of 1 μm or greater by means of laser annealing. A beam emitted from a laser apparatus (101) is split in two by a half mirror. The split beams are processed into linear shapes by cylindrical lenses (102) to (105), and (207), then simultaneously irradiate an irradiation surface (209). If an amorphous silicon film formed on a glass substrate is disposed on the irradiation surface (209), an area will be irradiated by both a linear shape beam entering from a front surface and a linear shape beam that has transmitted through the glass surface. Both linear shape beams irradiate the same area to thereby crystallize the amorphous silicon film.

18 Claims, 26 Drawing Sheets

U.S. PATENT DOCUMENTS

| | | | |
|---|---|---|---|
| 4,599,133 A | 7/1986 | Miyao et al. | 156/617 |
| 4,609,407 A | 9/1986 | Masao et al. | 148/1.5 |
| 4,659,422 A | 4/1987 | Sakurai | 117/43 |
| 4,925,273 A | 5/1990 | Maisenbacher et al. | 350/315 |
| 5,219,786 A | 6/1993 | Noguchi | 437/174 |
| 5,432,122 A | 7/1995 | Chae | 437/101 |
| 5,543,352 A | 8/1996 | Ohtani et al. | 437/101 |
| 5,561,081 A | 10/1996 | Takenouchi et al. | 437/174 |
| 5,594,569 A | 1/1997 | Konuma et al. | 349/122 |
| 5,612,250 A | 3/1997 | Ohtani et al. | 437/101 |
| 5,612,251 A | 3/1997 | Lee | 437/173 |
| 5,643,801 A | 7/1997 | Ishihara et al. | 437/7 |
| 5,744,824 A | 4/1998 | Kousai et al. | 257/74 |
| 5,767,003 A | 6/1998 | Noguchi | 438/487 |
| 5,817,548 A | 10/1998 | Noguchi et al. | 438/160 |
| 5,854,803 A | 12/1998 | Yamazaki et al. | 372/31 |
| 5,882,960 A | 3/1999 | Zhang et al. | 438/166 |
| 5,895,933 A | 4/1999 | Zhang et al. | 257/49 |
| 5,897,799 A | 4/1999 | Yamazaki et al. | 219/121 |
| 5,900,980 A | 5/1999 | Yamazaki et al. | 359/619 |
| 5,910,262 A | 6/1999 | Baumgart et al. | 219/121.77 |
| 5,952,058 A | 9/1999 | Xuan | 427/555 |
| 5,953,597 A | 9/1999 | Kusumoto et al. | 438/161 |
| 5,959,779 A | 9/1999 | Yamazaki et al. | 359/624 |
| 5,960,323 A | 9/1999 | Wakita et al. | 438/795 |
| 5,968,383 A | 10/1999 | Yamazaki et al. | 219/121 |
| 5,972,742 A | 10/1999 | Zhang et al. | 438/164 |
| 6,002,101 A | 12/1999 | Yamazaki et al. | 219/121 |
| 6,002,523 A | 12/1999 | Tanaka | 359/624 |
| 6,020,045 A | 2/2000 | Chen et al. | 428/141 |
| 6,038,075 A | 3/2000 | Yamazaki et al. | 359/626 |
| 6,051,453 A | 4/2000 | Takemura | 438/166 |
| 6,088,379 A | 7/2000 | Owa et al. | 372/97 |
| 6,091,047 A | 7/2000 | Miyakawa et al. | 219/121.68 |
| 6,108,464 A | 8/2000 | Foresi et al. | 385/14 |
| 6,133,076 A | 10/2000 | Yamazaki et al. | 438/166 |
| 6,171,890 B1 | 1/2001 | Adachi et al. | 438/162 |
| 6,190,949 B1 | 2/2001 | Noguchi et al. | 438/149 |
| 6,210,996 B1 | 4/2001 | Yamazaki et al. | 438/150 |
| 6,266,167 B1 | 7/2001 | Klug et al. | 359/12 |
| 6,300,176 B1 | 10/2001 | Zhang et al. | 438/166 |
| 6,310,362 B1 | 10/2001 | Takemura | 257/59 |
| 6,322,625 B2 | 11/2001 | Im | 117/43 |
| 6,380,044 B1 | 4/2002 | Talwar et al. | 438/308 |
| 6,423,585 B1 * | 7/2002 | Yamazaki et al. | 438/166 |
| 6,426,245 B1 * | 7/2002 | Kawasaki et al. | 438/166 |
| 6,548,370 B1 | 4/2003 | Kasahara et al. | 438/FOR. 419 |
| 6,599,799 B2 * | 7/2003 | Tang et al. | 438/253 |
| 6,927,109 B1 * | 8/2005 | Tanaka et al. | 438/166 |
| 2003/0203656 A1 | 10/2003 | Kasahara et al. | 438/795 |

FOREIGN PATENT DOCUMENTS

| | | |
|---|---|---|
| JP | 09-283443 | 10/1997 |
| JP | 11-097702 | 4/1999 |
| JP | 11-133463 | 5/1999 |

OTHER PUBLICATIONS

Kasahara, et al., "Laser Apparatus and Laser Annealing Method," U.S. Appl. No. 09/640,521, filed Aug. 17, 2000, pp. 1-57, 19 pages of drawings.

Kasahara, et al., Amendment to U.S. Appl. No. 09/640,521, mailed to the United States Patent and Trademark Office on Dec. 2, 2002, pp. 1-5.

Kasahara, et al., "Laser Apparatus and Laser Annealing Method," U.S. Appl. No. 09/640,521, filed Aug. 17, 2000, Official Filing Receipt.

Kasahara, et al., "Laser Apparatus and Laser Annealing Method," U.S. Appl. No. 09/640,521, filed Aug. 17, 2000, additional new claims added after filing.

Im, J.S. et al., "Phase Transformation Mechanisms Involved in Excimer Laser Recrystallization of Amorphous Silicon Films," Applied Physics Letters, vol. 63, No. 14, pp. 1969-1971, Oct. 4, 1993.

* cited by examiner

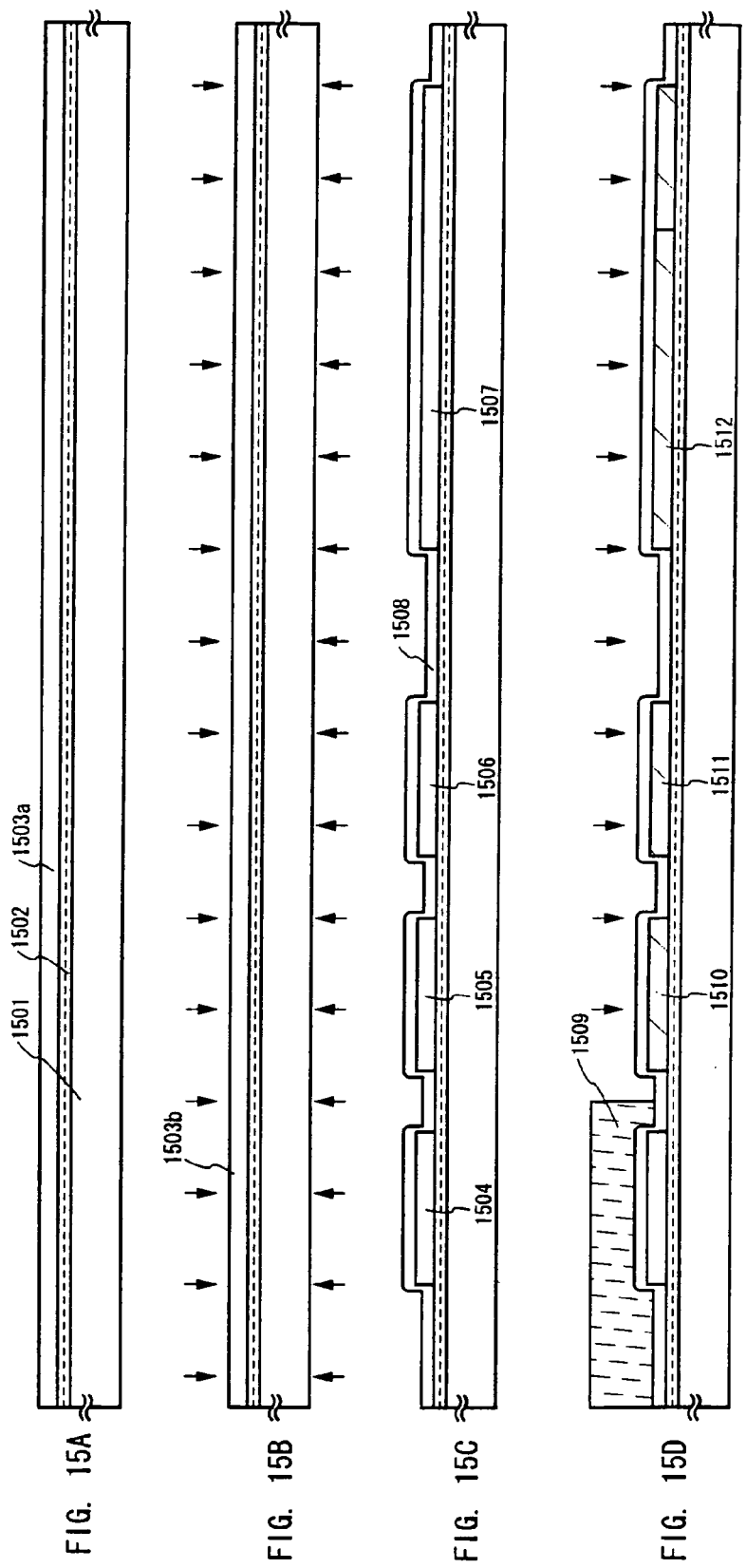

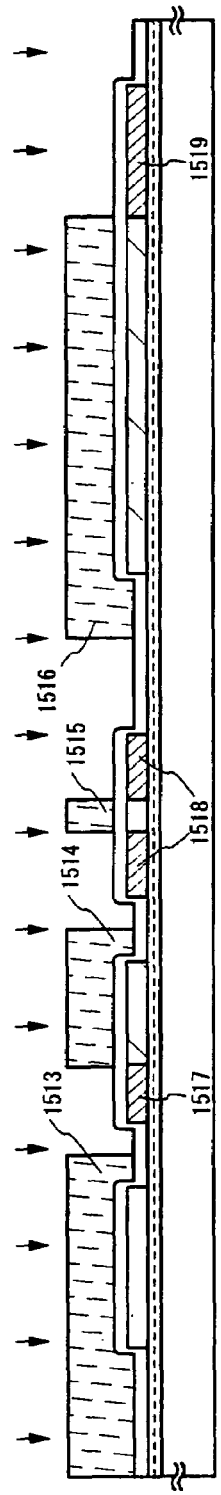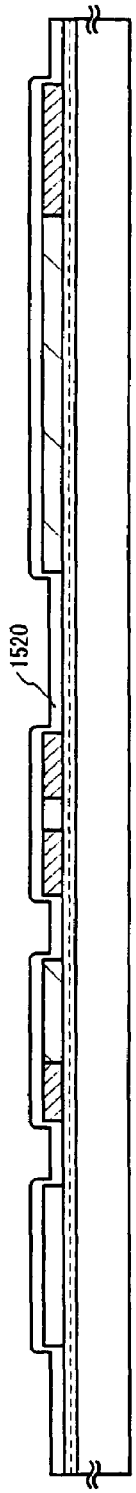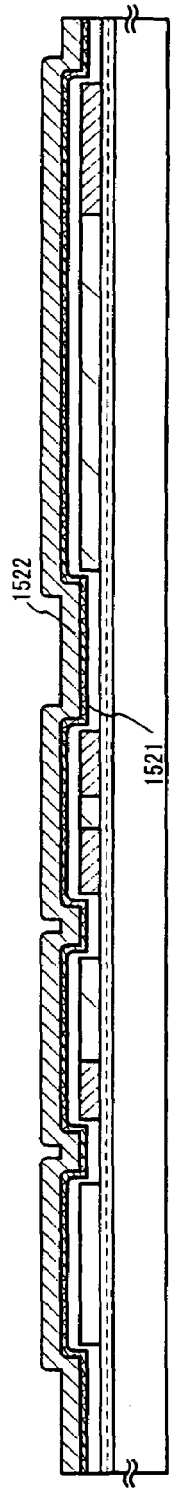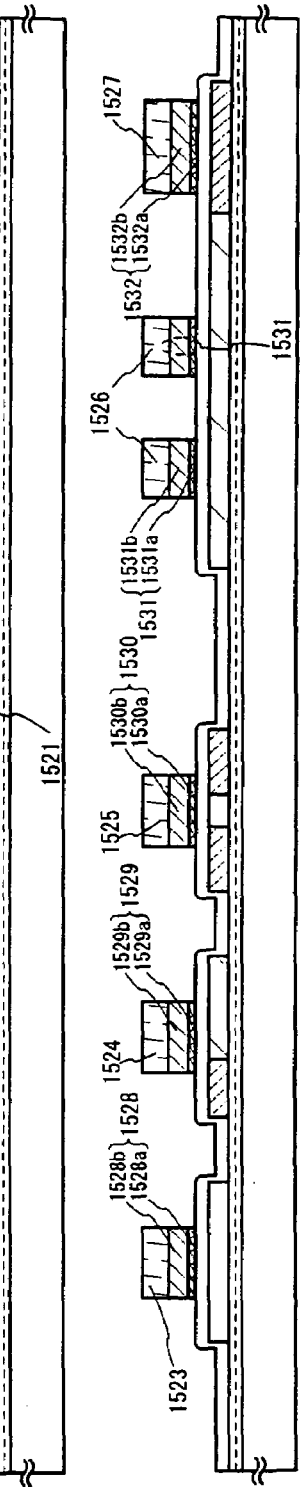

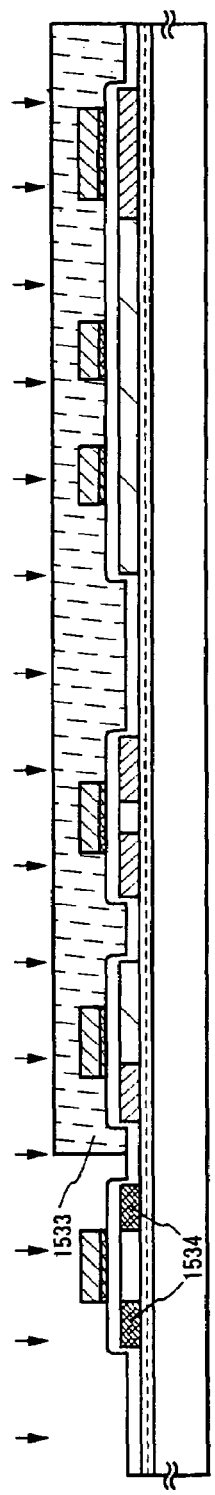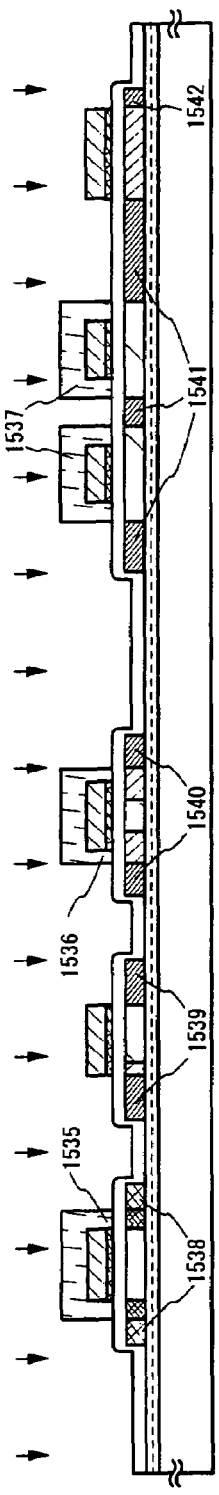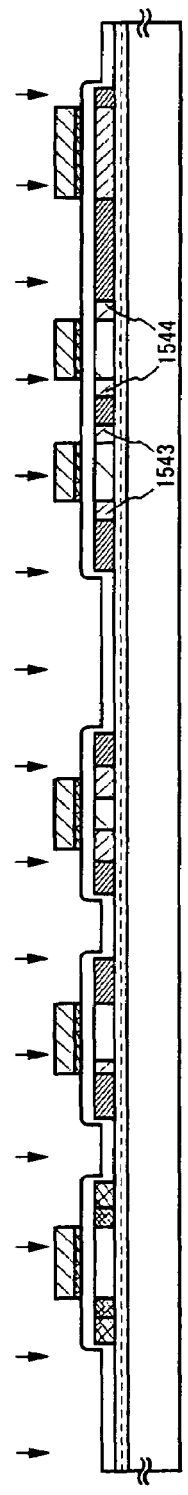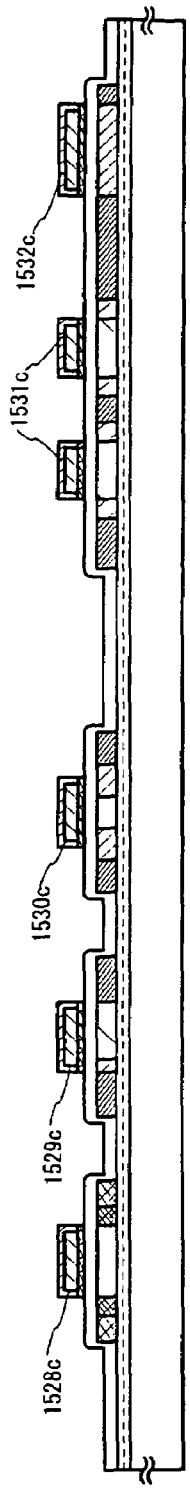

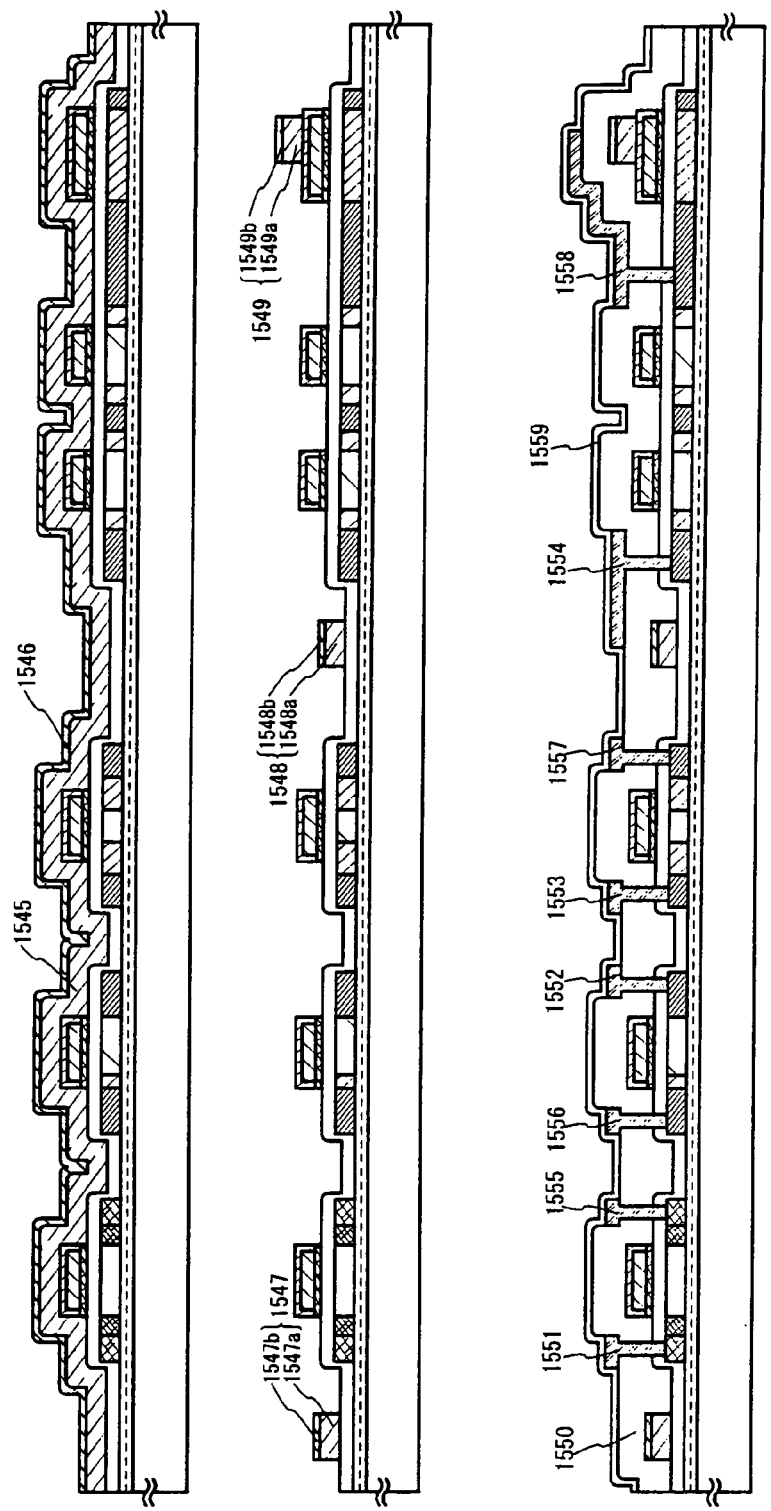

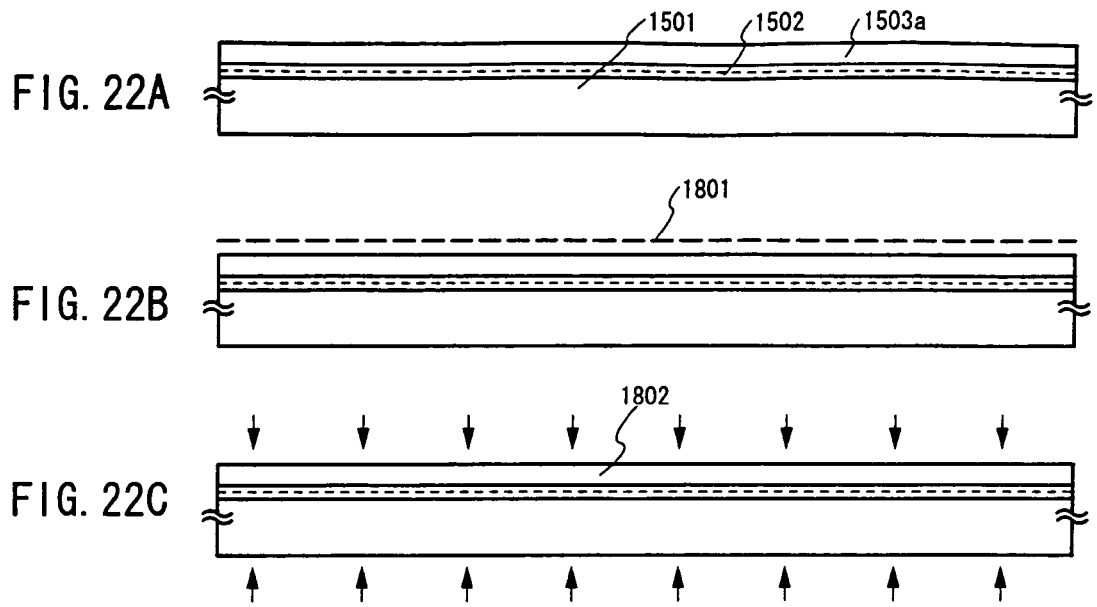
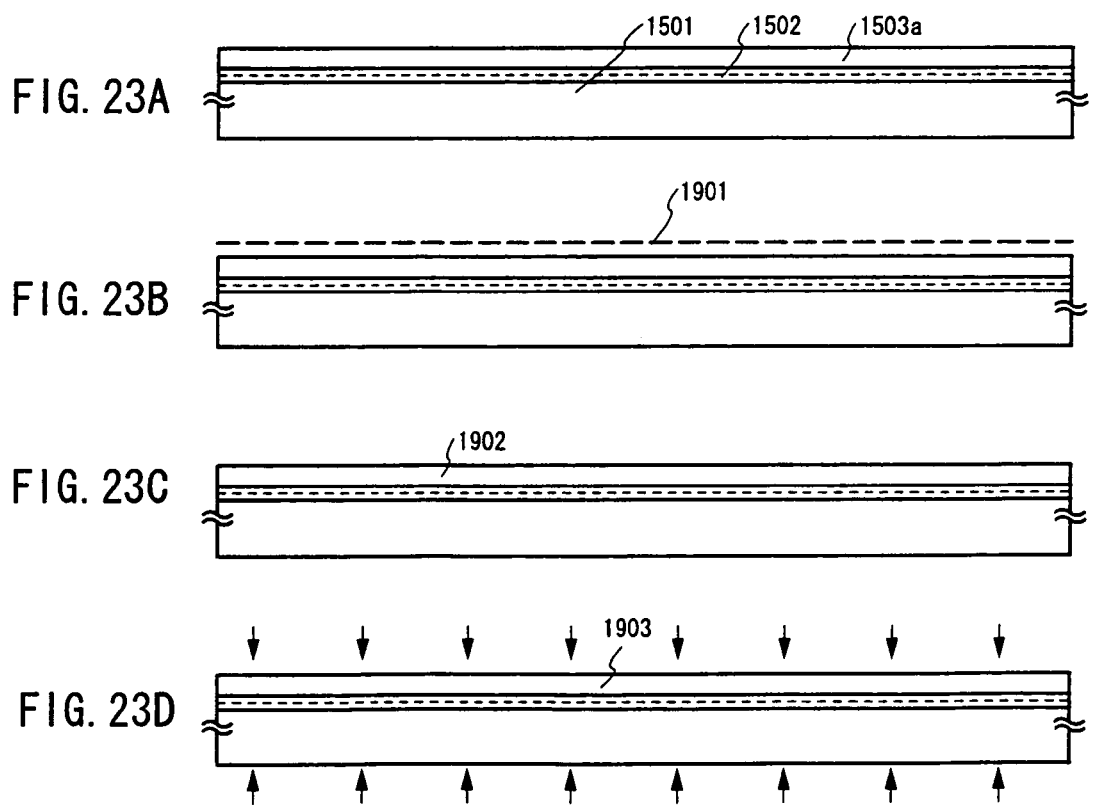

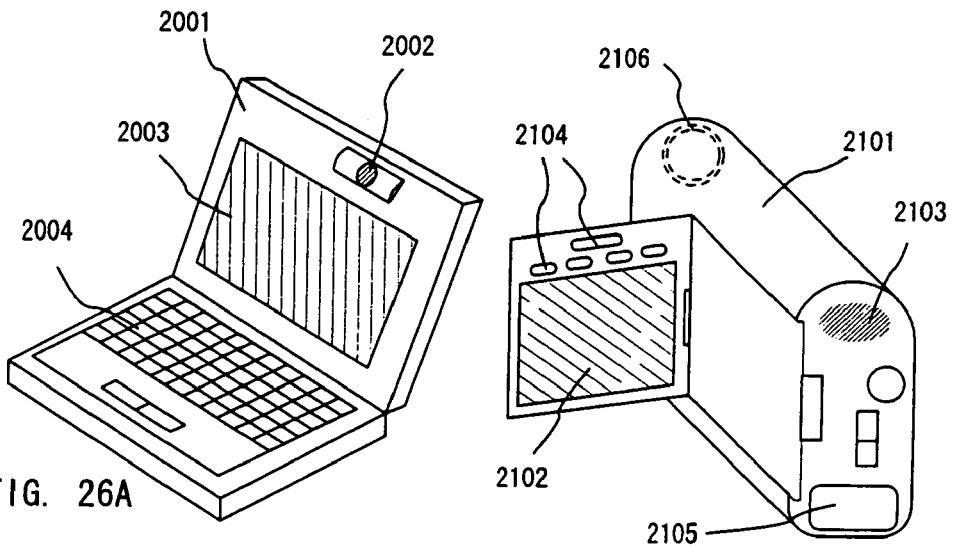
FIG. 26A
FIG. 26B
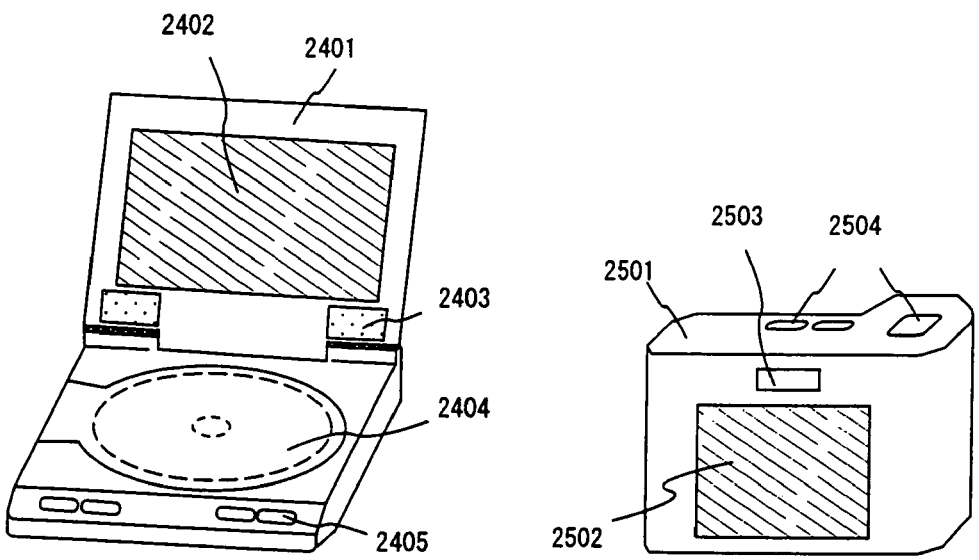
FIG. 26C
FIG. 26D
FIG. 26E
FIG. 26F

LASER IRRADIATION APPARATUS, LASER IRRADIATION METHOD, SEMICONDUCTOR DEVICE, AND METHOD OF MANUFACTURING A SEMICONDUCTOR DEVICE

This application is a divisional of U.S. application Ser. No. 09/610,637 filed on Jul. 5, 2000 now U.S. Pat. No. 6,927,109.

BACKGROUND OF THE INVENTION

1. Field of the Invention

The present invention relates to an apparatus for manufacturing a semiconductor device having a circuit comprising thin film transistors. For example, the invention relates to an apparatus for manufacturing an electro-optical device, typically a liquid crystal display device, and the structure of electric equipment mounted with such an electro-optical device as a component. Note that throughout this specification, the semiconductor device indicates general devices that may function by use of semiconductor characteristics, and that the above electro-optical device and electric equipment are categorized as the semiconductor device.

2. Description of the Related Art

In recent years, the technique of crystallizing and improving the crystallinity of an amorphous semiconductor film or a crystalline semiconductor film (a semiconductor film having a crystallinity which is polycrystalline or microcrystalline, but is not a single crystal), in other words, a non-single crystal silicon film, formed on an insulating substrate such as a glass substrate by laser annealing, has been widely researched. Silicon film is often used as the above semiconductor film.

Comparing a glass substrate with a quartz substrate, which is often used conventionally, the glass substrate has advantages of low-cost and great workability, and can be easily formed into a large surface area substrate. This is why the above research is performed. Also, the reason for preferably using a laser for crystallization resides in that the melting point of a glass substrate is low. The laser is capable of imparting high energy only to the non-single crystalline film without causing much change in the temperature of the substrate.

The crystalline silicon film is formed from many crystal grains. Therefore, it is called a polycrystalline silicon film or a polycrystalline semiconductor film. A crystalline silicon film formed by laser annealing has high mobility. Accordingly, it is actively used in, for example, monolithic type liquid crystal electro-optical devices where thin film transistors (TFTs) are formed using this crystalline silicon film and used as TFTs for driving pixels and driving circuits formed on one glass substrate.

Further, a method of performing laser annealing by processing a high output pulse laser beam, such as an excimer laser, by means of optical system into a square spot of several centimeters, or into a linear shape of 10 cm or more, on the surface to be irradiated, and scanning the laser beam (or by moving the laser beam irradiation position relatively to the surface to be irradiated), has been preferably used because it has a high degree of mass productivity and is industrially excellent.

In particular, if a linear shape laser beam is used, a high degree of mass productivity can be obtained because laser irradiation can be performed on the entire surface to be irradiated by merely scanning at a right angle to the longitudinal direction of the linear shape laser, unlike the case of using a spot shape laser beam in which it is necessary to scan forward, back, left, and right. Scanning is made at a right angle to the longitudinal direction because it is the most efficient scanning direction. On account of this high mass productivity, the use in laser annealing of a linear shape laser beam in which a pulse oscillation excimer laser beam is processed by a suitable optical system, is now becoming a mainstream.

A polycrystalline silicon film can be obtained for the case of processing the pulse emission excimer laser beam into a linear shape and irradiating the linear shape laser beam while scanning, for example, on a non-single crystal silicon film.

The consequences of carefully studying or examining the obtained polycrystalline silicon film lead to a known fact that the polycrystalline silicon film is formed of a single crystal made of an infinite number of crystal grains with a grain size of several hundred nanometers. A large number of lattice defects exist in the grain boundary of these crystal grains causing substantial damages to the characteristics of a semiconductor device.

This problem can be resolved by making the grain size larger so that the lattice defect density may be reduced.

Laser irradiation has been performed on the non-single crystal silicon film under various possible conditions to resolve the above problem. However, the average grain size of the polycrystalline silicon film obtained could not be larger than 500 nm.

For example, irradiating a laser under a nitrogen atmosphere, or under a vacuum state, or under a heated state. A method of combining these methods in which the conditions are optimized was also tried. In any case, the grain size could not be made markedly bigger by any of the methods.

SUMMARY OF THE INVENTION

An object of the present invention is to solve the above problem by providing a laser irradiation apparatus and a laser irradiation method to thereby grow 500 nm or larger, preferably 1 μm or greater, crystal grains.

After many trial and errors, the present inventors have discovered a method of using a laser to make the average grain size in a polycrystalline silicon film to be between 500 nm and 3 μm, and further be between 1 and 3 μm by optimizing the conditions. The following is an explanation of this method.

First, a high output excimer laser is prepared as a light source. Then, a suitable optical system is used to thereby make the energy in an irradiation surface become uniform. The optical system used is shown in FIGS. 1A and 1B. Due to this, a rectangular beam is transformed into a long, thin, linear beam, and the energy within the beam is further made uniform at the same time.

FIGS. 1A and 1B are diagrams showing an example of the structure of an optical system for forming a linear shape laser beam. Since this structure is a very general structure, all other optical systems for forming linear shape laser beams conform to the structure indicated in FIGS. 1A and 1B.

The side view FIG. 1A will be explained first. A beam outputted from a laser oscillator 101 is split in a vertical direction by a cylindrical lens array 102. The split beam is once formed into one beam by a cylindrical lens 104 and then reflected by a mirror 107. Subsequently, the beam is once again formed into one beam on an irradiation surface 109 by a condensing cylindrical lens 108. Due to this, the homogeneity of the energy in the width direction and the length of the width direction of the linear shape laser beam are thus determined.

The top view FIG. 1B will be explained next. The beam emitted from the laser oscillator 101 is split in a horizontal direction by a cylindrical lens array 103. Then, the split beam is synthesized into one beam on the irradiation surface 109 by the cylindrical lens 104. Due to this, the homogeneity of the energy in the longitudinal direction and the length of the linear shape laser beam are thus determined.

The following experiment was carried our using the optical system indicated in FIGS. 1A and 1B.

First, a 0.7 mm thick 5 inch square Corning 1737 substrate is prepared as a substrate. A 200 nm thick $SiO_2$ film (silicon oxide film) is deposited on the substrate and a 50 nm thick amorphous silicon film (hereinafter referred to as a-Si film) is deposited on the surface of the $SiO_2$ film. Plasma CVD is used for both film depositions.

The substrate is then exposed in an atmosphere containing nitrogen gas at 500° C. for 1 hour to thereby reduce the concentration of hydrogen in the amorphous silicon film. This process has considerably improved the film characteristic to withstand laser energy.

The XeCl excimer laser L3308 (a product of LAMBDA PHYSIK, wavelength of 308 nm and pulse width of 30 ns) is used as a laser apparatus. This laser apparatus is capable of emitting a pulse oscillation laser having energy of 500 mJ/pulse. The laser beam is processed into a 100 mm×0.4 mm linear shape laser beam by means of the optical system having the structure as shown in FIGS. 1A and 1B. Note that throughout this specification, the longer sides of the linear shape laser beam indicate a longitudinal direction and the shorter sides indicate a width direction.

The linear shape laser beam is simultaneously irradiated from a front surface and a back surface of the substrate on which the a-Si film is formed. Throughout this specification, for the purpose of explanation, the front surface of the substrate indicates the surface on which the a-Si film is formed and the back surface indicates the opposite side.

The absorption coefficient of the a-Si film with respect to an excimer laser is very high. Practically, an excimer laser having a wavelength of 308 nm cannot transmit a 50 nm thick a-Si film. It is then known from this fact that the excimer laser will be completely transformed into heat in the 50 nm thick a-Si film. (Excluding the reflected light from the surface of the a-Si film.) Theoretically speaking, a light wavelength of 308 nm is attenuated to 1/e in the area about a depth of 10 nm from the surface of the a-Si film.

The following fact can be expected from the above theory. That is, if the conventional method of performing crystallization of the a-Si film by a laser irradiated from only the front surface of the a-Si film is employed, the temperature of an area furthermost away from the surface of the 50 nm thick a-Si film is the lowest with respect to the temperature distribution in the depth direction of the 50 nm thick a-Si film. On the contrary, if a laser is irradiated simultaneously from the front and back surfaces of the a-Si film according to a method indicated by the present invention, compared with the conventional example, the temperature distribution in the depth direction within the 50 nm thick a-Si film is more equal. Accordingly, comparing a period from melting the a-Si film by laser until the formation of a crystal nucleus of the conventional example with the method according to the present invention, the method according to the present invention takes much longer. It is considered that this difference in time comes out as the difference in the diameter of the crystal grain.

When irradiating a laser beam, a repetition frequency of the laser beam is set to 30 Hz, a moving velocity of the substrate is set to 1 mm/s, and the energy density of the laser is set to 190 mJ/cm$^2$ for the respective linear shape beams irradiated from the front and back surfaces of the substrate. The optimum value of the energy density is different depending upon the type of laser apparatus, therefore it is appropriate to set the energy density between 100 to 500 mJ/cm$^2$.

The 0.7 mm thick Corning 1737 substrate has about 50% of transmittance with respect to a 308 nm wavelength light. Also, almost 100% of laser light with a wavelength of 308 nm is transmitted through the $SiO_2$ film. The 50 nm thick a-Si film absorbs about 50% of the laser light having a wavelength of 308 nm, and the remaining 50% is reflected.

Accordingly, the a-Si film is not only directly irradiated by the linear shape beam from the front surface of the substrate, but also irradiated by the linear shape beam irradiated from the back surface of the substrate. The energy of the linear shape beam irradiated from the back surface is attenuated to half of the energy of the beam directly irradiated from the front surface.

By irradiating the linear shape laser simultaneously from the front and back surface while scanning, the a-Si film is crystallized and a polycrystalline silicon film can be obtained. After performing Secco etching to the obtained polycrystalline silicon film, the average grain size was about 1 to 2 µm when the surface was observed under a SEM.

For the sake of comparing, first a linear shape beam having the same energy density is irradiated from the front surface of the substrate. Then a linear shape beam is irradiated from the back surface. The surface of the obtained polycrystalline silicon film, after Secco etching, is observed under a SEM, and the average grain size was approximately 300 nm.

In other words, it is extremely important to irradiate a laser simultaneously from the front and back surfaces in order to form a polycrystalline silicon film with a crystal grain of 1 µm or more in size. Similar results could not be attained when the laser light is irradiated in order, from one side and then the other side, on the a-Si film.

The present invention has been invented on the basis of such knowledge. According to one aspect of the invention, there is provided a laser irradiation apparatus for irradiating a laser beam simultaneously from a front and a back surface of a substrate, characterized by comprising a means of moving the substrate in the direction parallel to the direction of gravity.

Further, according to another aspect of the present invention, there is provided a laser irradiation apparatus for irradiating a laser beam simultaneously from the front and the back surface of the substrate, characterized in that: a shape of an irradiation region of a first laser beam irradiated from the front surface and a shape of an irradiation region of a second laser beam irradiated from the back surface are a linear shape or a band shape; the irradiation region of the first laser beam and the irradiation region of the second laser beam are parallel to each other; and the apparatus comprises means for moving the substrate in the width direction of the irradiation region when the first laser beam and the second laser beam are being irradiated.

Still further, according to another aspect of the present invention, there is provided a laser irradiation apparatus for irradiating a laser beam simultaneously from the front and the back surface of the substrate, characterized in that: a shape of an irradiation region of a first laser beam irradiated from the front surface and a shape of an irradiation region of a second laser beam irradiated from the back surface are a linear shape or a band shape; the irradiation region of the first laser beam and the irradiation region of the second laser beam are parallel to each other; a width of the irradiation region of the first laser beam is smaller than a width of the irradiation region of the second laser beam irradiated from the back surface; and the apparatus comprises means for moving the substrate in the width direction of the irradiation region when the first laser beam and the second laser beam are being irradiated.

Regarding any of the above aspects of the present invention, it is preferred that the substrate be arranged in a direction parallel to the direction of gravity when irradiating a laser so that the bending of the substrate will not occur easily.

Also, regarding any of the above aspects of the present invention, the grain size of the polycrystalline semiconductor film can be made to be 500 nm or more when the energy of the laser beam, for irradiating the substrate from the side of the substrate upon which the non-single crystal semiconductor film is formed (the front surface of the substrate), is higher than the energy of the laser beam for irradiating the substrate from the side upon which the non-single crystal semiconductor film is not formed (the back surface of the substrate).

Regarding any of the above aspects of the present invention, the grain size of the polycrystalline semiconductor film can be made even more larger when the ratio of the energy of the laser beam, for irradiating the substrate from the side of the substrate upon which the non-single crystal semiconductor film is formed (the front surface of the substrate), and the energy of the laser beam for irradiating the substrate from the side upon which the non-single crystal semiconductor film is not formed (the back surface of the substrate) is between 1 to 1 and 10 to 1, preferably between 6 to 4 and 8 to 2. In other words, the energy of the laser beam for irradiating the substrate from the side upon which the non-single crystal semiconductor film is not formed, should be the same or $1/10$ or greater than the energy of the laser beam for irradiating the substrate from the side of the substrate upon which the non-single crystal semiconductor film is formed.

It is preferable that any of the laser irradiation apparatus according to the present invention have at least a load/unload chamber, a transfer chamber, a preheat chamber, a laser irradiation chamber, and a cooling chamber since the apparatus can be then utilized in a mass production.

Further, according to another aspect of the present invention, there is provided a semiconductor device characterized by utilizing a crystalline semiconductor film having a crystal grain size of between 500 nm and 3 µm as an active layer. In addition, regarding a method of manufacturing a semiconductor device in order to obtain the above semiconductor device thus structured, there is provided a method of manufacturing a semiconductor device with a TFT formed on a substrate, the method characterized by comprising the steps of: forming a non-single crystal semiconductor film on the substrate, and a process of simultaneously irradiating a first laser beam irradiated from the front surface of the substrate and a second laser beam irradiated from the back surface of the substrate to thereby form a crystalline semiconductor film.

Further, according to another aspect of the present invention, a method of manufacturing a semiconductor device having a TFT formed on a substrate is characterized by comprising the steps of: forming a non-single crystal semiconductor film on the substrate; introducing a metal element into the non-single crystal semiconductor film for promoting the crystallization of a semiconductor; and simultaneously irradiating a first laser beam irradiated from the front surface of the substrate and a second laser beam irradiated from the back surface of the substrate to thereby form a crystalline semiconductor film.

Further, according to another aspect of the present invention, a method of manufacturing a semiconductor device having a TFT formed on a substrate is characterized by comprising the steps of: forming a non-single crystal semiconductor film on the substrate; introducing a metal element into the non-single crystal semiconductor film for promoting the crystallization of a semiconductor; performing heat treatment to the non-single crystal semiconductor film to thereby form a crystalline semiconductor film; and simultaneously irradiating a first laser beam irradiated from the front surface of the substrate and a second laser beam irradiated from the back surface of the substrate to the crystalline semiconductor film.

According to each of the above methods of manufacturing a semiconductor device, the energy of the first laser beam is higher than the energy of the second laser beam.

BRIEF DESCRIPTION OF THE DRAWINGS

In the accompanying drawings:

FIGS. 15A to 15D are diagrams showing an example of a manufacturing process according to the present invention;

FIGS. 16A to 16D are diagrams showing an example of a manufacturing process according to the present invention;

FIGS. 17A to 17D are diagrams showing an example of a manufacturing process according to the present invention;

FIGS. 18A to 18C are diagrams showing an example of a manufacturing process according to the present invention;

FIGS. 22A to 22C are diagrams showing an example of a manufacturing process according to the present invention;

FIGS. 23A to 23D are diagrams showing an example of a manufacturing process according to the present invention;

FIGS. 26A to 26F are diagrams showing examples of electronic equipment; and

DETAILED DESCRIPTION OF THE PREFERRED EMBODIMENTS

Embodiment Mode

First, an example of a laser light being simultaneously laser irradiated from a front surface and a back surface of a 600×720 mm large surface area substrate as the object of irradiation is shown.

Figure 1A:
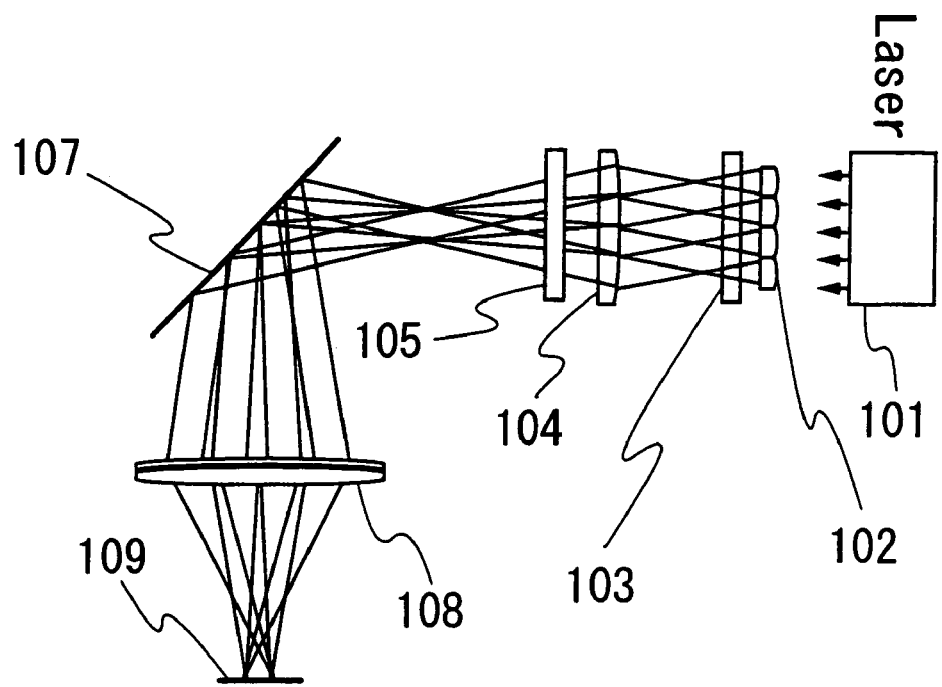
FIGS. 1A and 1B show an optical system for forming a linear shape laser beam.
Figure 1B:
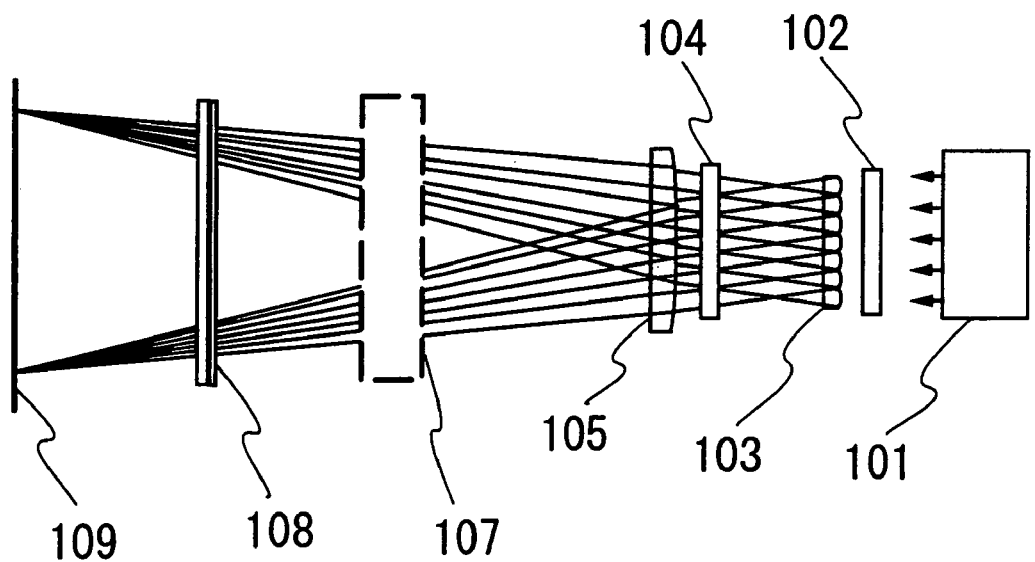
Figure 2:
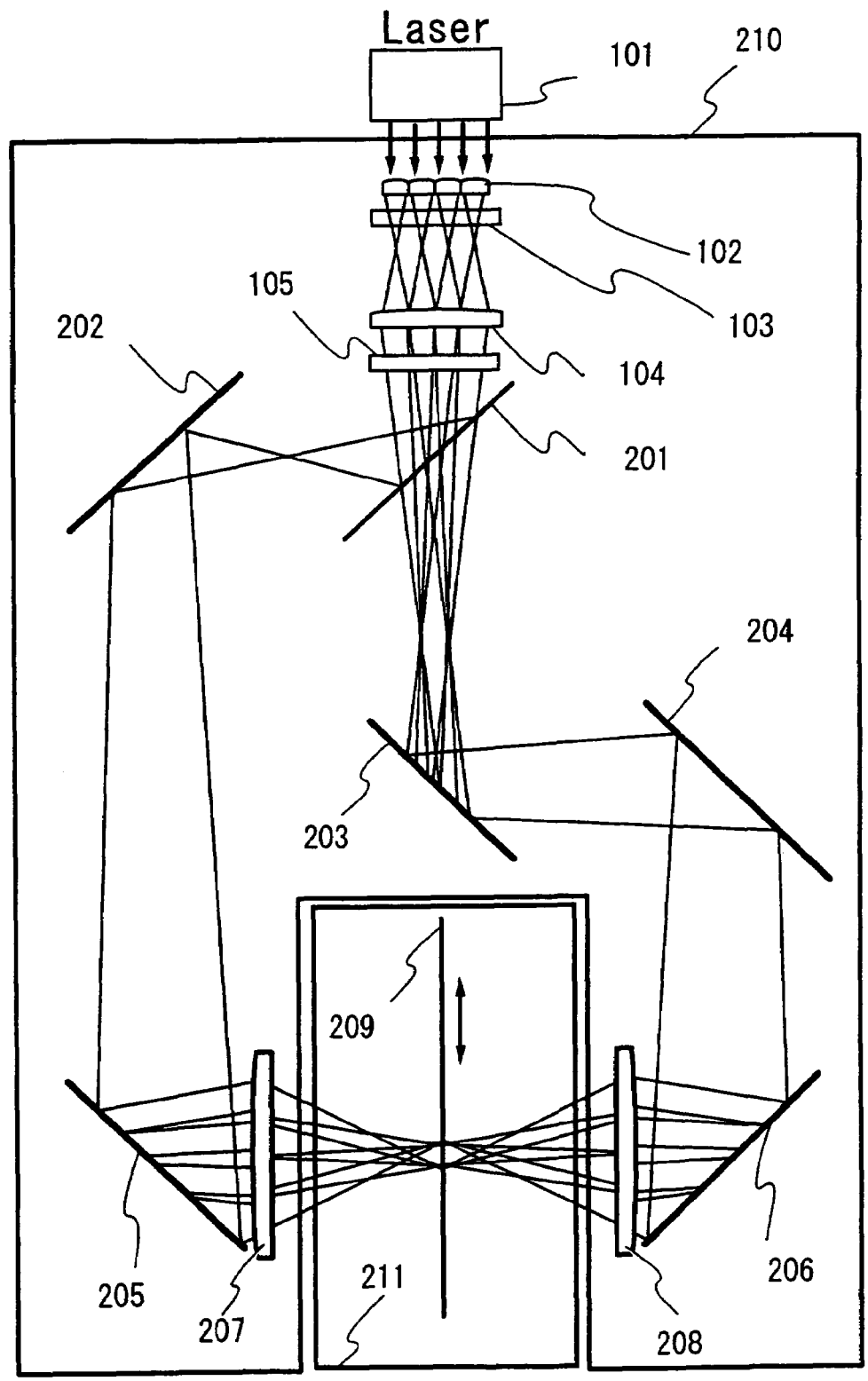
FIG. 2 shows a laser irradiation apparatus.

An optical system is shown in FIG. 2. In FIG. 2, the symbols that are the same as that of FIGS. 1A and 1B indicate the same members. The optical system shown in FIG. 2 has a structure in which a light path from the cylindrical lens 105 of FIGS. 1A and 1B onward, is divided in 2 by a half mirror 201.

Assuming that the transmittance of the half mirror 201 is 50%, then the reflectance also becomes 50%. Accordingly, a beam is split by this mirror into two beams having equal energy. Of the split beams, the one reflected by the half mirror 201 is reflected by mirrors 202 and 205 and is condensed into a linear shape on an irradiation surface 209 by a cylindrical lens 207. On the other hand, the beam that has transmitted through the half mirror 201 is reflected by mirrors 203, 204, and 206, and is condensed into a linear shape on the irradiation surface 209 by a cylindrical lens 208.

A substrate on which a non-single crystal semiconductor film is formed is disposed on the irradiation surface 209. A linear shape laser beam is simultaneously irradiated from a front and a back surface of the substrate. The laser beam can be irradiated on the entire surface of the substrate by moving the substrate in the direction indicated by an arrow.

The energy of the linear shape beam according to the present invention is that the energy of the beam irradiated to the substrate from the side upon which the non-single crystal semiconductor film is formed, is equal to or greater than the energy of the beam being irradiated to the substrate from the other side. It is appropriate to set the ratio of the former energy and the latter energy to be between 6:4 and 8:2.

To adjust the energy of the linear shape beam, adjust the transmittance (reflectance) of the half mirror 201 for the optical system of FIG. 2.

For the protection of the optical system, the gas in the atmosphere of the optical system may be gas that has difficulty in reacting to a lens coating substance, such as nitrogen. For this purpose, the optical system may be enclosed in an optical system protection room 210. Quartz is used in a window for the exit/entering of a laser from the optical system protection room 210. Also, in order to prevent contamination of the substrate 209, a chamber 211 may be provided. Laser irradiation can be performed under the state in which the substrate 209 is placed in the chamber 211.

Figure 3:
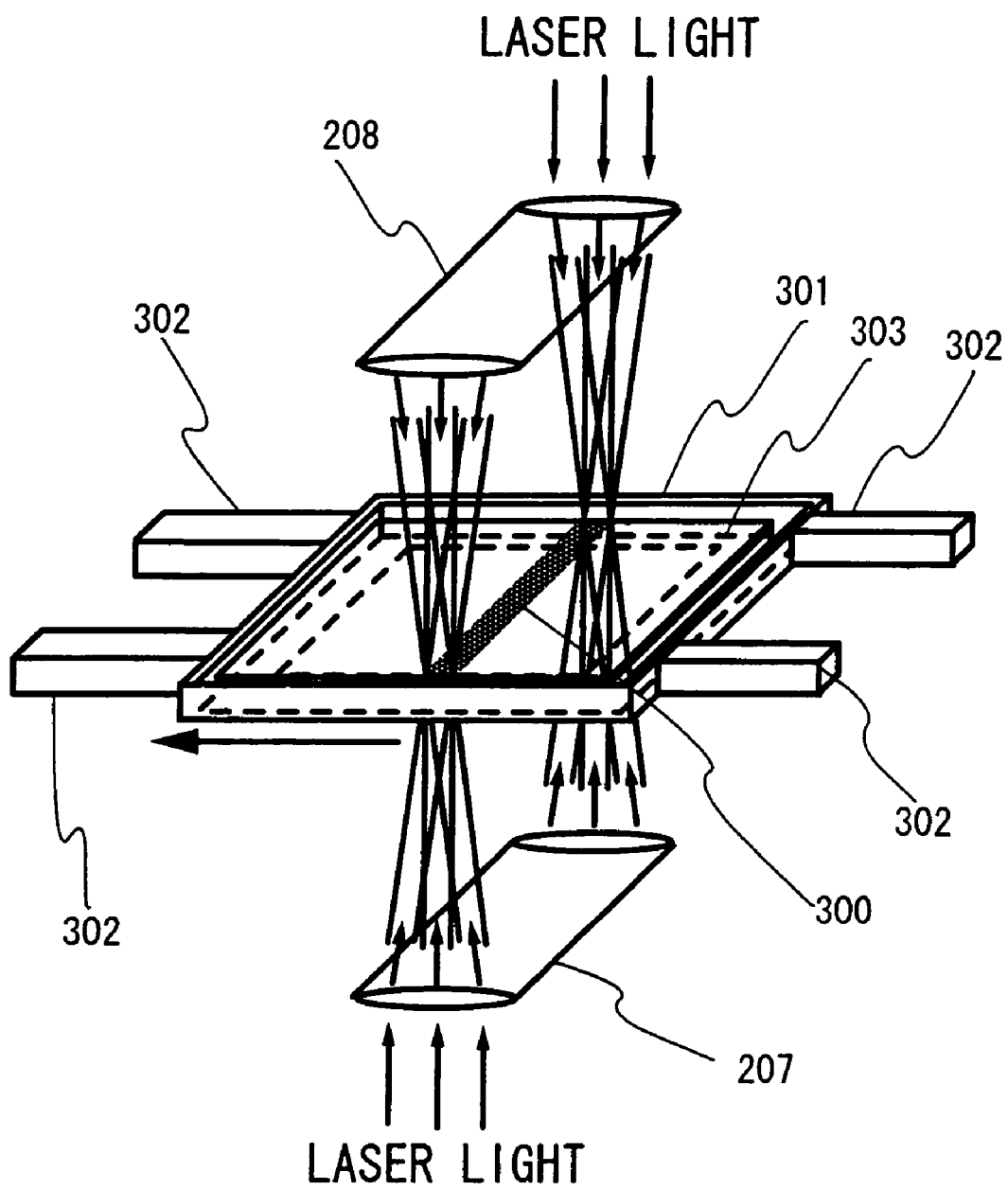
FIG. 3 is a diagram showing a substrate moving means.

FIG. 3 is a diagram showing a holding means and a moving means of a substrate. In FIG. 3, a laser beam 300 is simultaneously irradiated from the front surface and the back surface of a substrate 303 via the cylindrical lens 207 and 208. A cavity is cut in a stage 301 to set the substrate therein. The stage supports only the edges of the substrate and the other portions are in midair so that the laser can also be irradiated from the back surface of the substrate 303. In other words, a rectangular hole a bit smaller than the substrate is provided in the stage. A moving mechanism 302 moves the stage 301, in a uniform velocity, in a perpendicular direction with respect to the longitudinal direction of the linear shape beam 300.

In order to irradiate the laser light simultaneously from the front surface and the back surface, it is necessary that the laser beam is not blocked at least in an area the laser beam is irradiated, or the stage for the substrate needs to be transparent to the laser light. For the case of using an excimer laser as the laser light, which is an ultraviolet light, a quartz substrate is used because quartz is a suitable material for transmission of ultraviolet light.

However, it is extremely difficult to process a quartz plate into a large surface area substrate. In addition, with a stage such as the one shown in FIG. 3 which supports only the edges of the substrate, especially in the case of a 600 mm×720 mm large surface area substrate, the substrate warps due to its own weight. Accordingly, a uniform laser irradiation cannot be performed for the laser beam cannot be focused properly.

Figure 6:
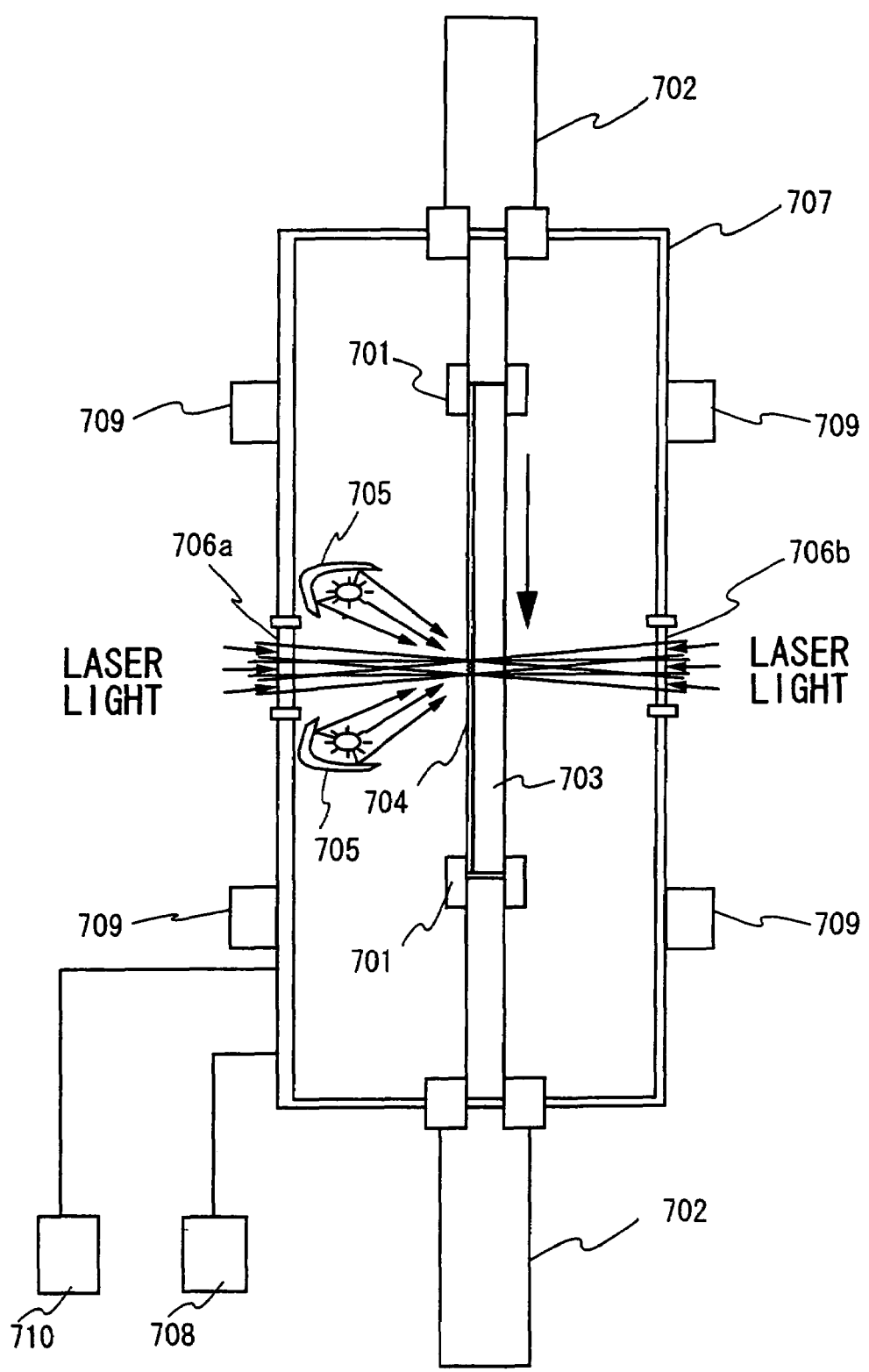
FIG. 6 is a diagram showing a laser irradiation apparatus.

Therefore, the stage for supporting a substrate, especially a large surface area substrate, should be structured as shown in FIG. 6 in which a substrate 703 is supported in an upright position. In other words, the substrate is arranged in a position parallel to the direction of gravity to thereby prevent the substrate from warping. Suitable supporting tools 701 holds the substrate 703. A vacuum chuck or a means such as physically fastening the edges of the substrate can be adopted as the supporting tools 701 to hold the substrate. In FIG. 6, two edges of the substrate, the top and bottom, are held, although in order to stabilize the holding of the substrate more, it can be a structure in which four edges of the substrate are fastened by supporting tools 701.

During laser irradiation, a spot on the substrate 703 that is irradiated by the laser is irradiated with a strong light and heated by a lamp 705, as shown in FIG. 6. Accordingly, a polycrystalline silicon film with bigger grain sizes can be obtained.

Figure 7:
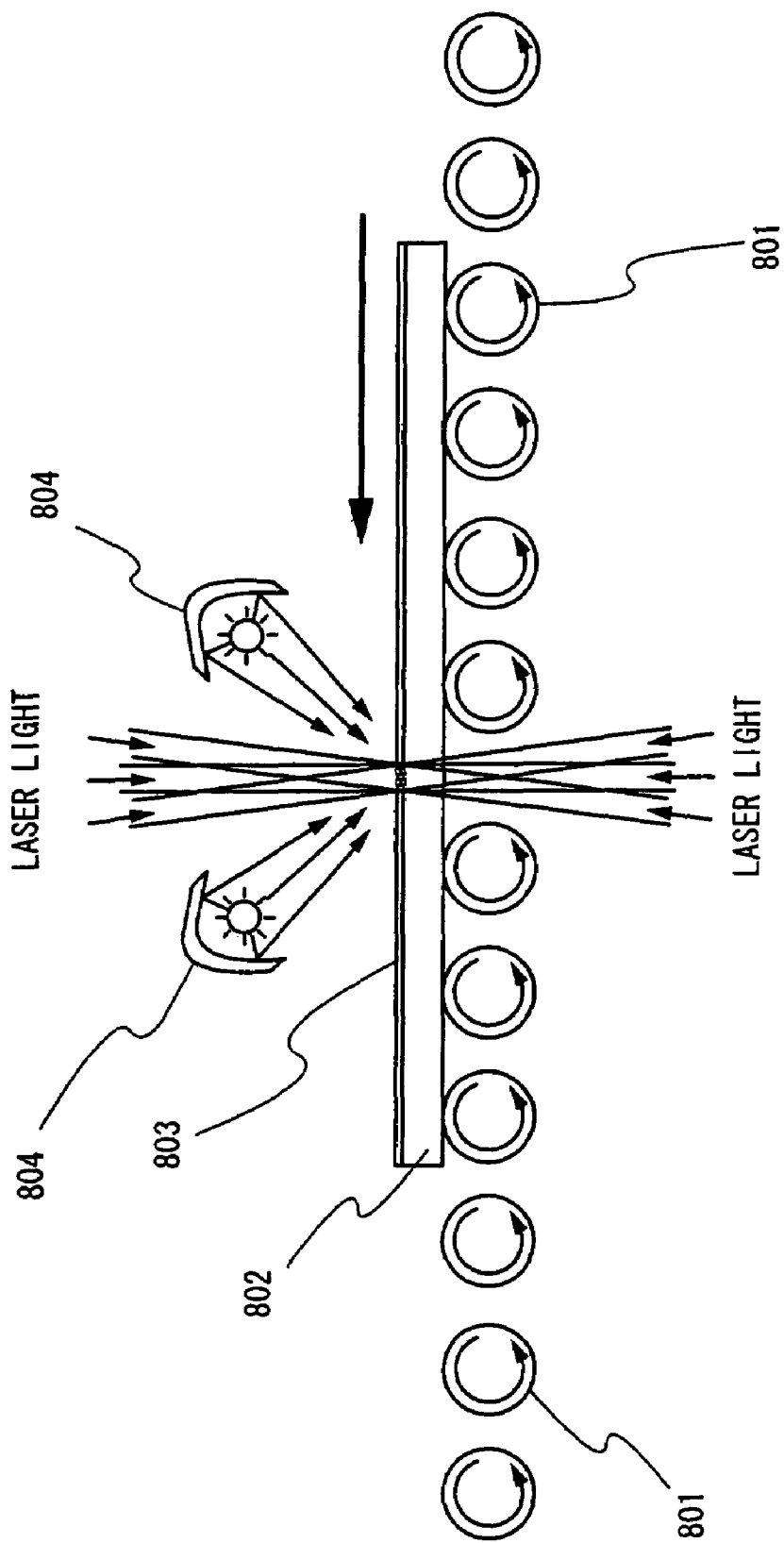
FIG. 7 is a diagram showing a laser irradiation apparatus.

As other substrate supporting means, the structure shown in FIG. 7 can be taken. In the structure of FIG. 7, a substrate 802 is arranged horizontally on cylindrical shape rollers 801 as in the conventional way. Under this situation, if all the cylindrical shape rollers 801 are rotated in one direction, then the substrate 802 is moved in one direction.

Figure 8:
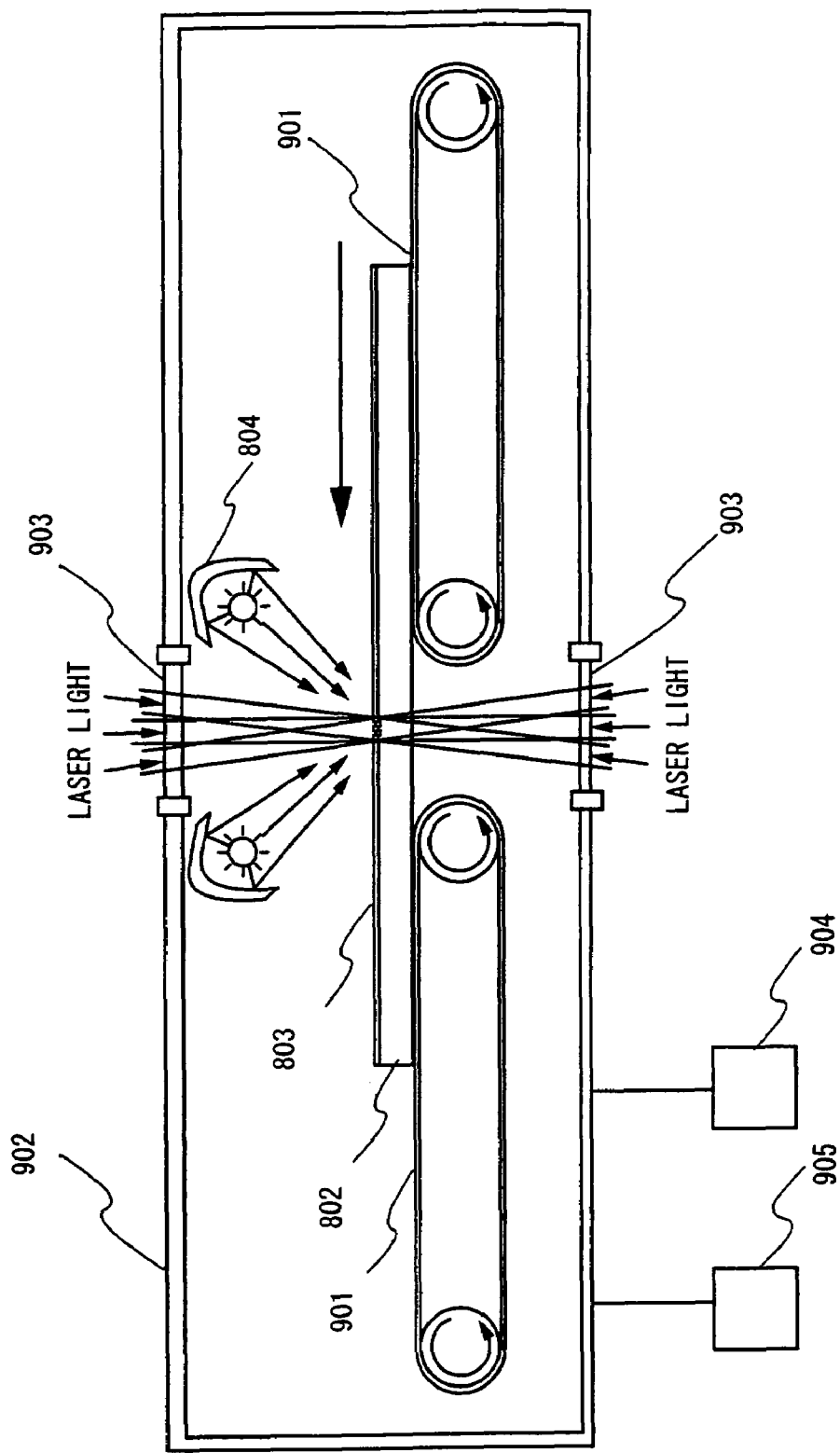
FIG. 8 is a diagram showing a laser irradiation apparatus.

The laser beam enters through the gaps of the cylindrical shape rollers. Accordingly, it is possible to irradiate the entire surface substrate by irradiating the laser light simultaneously from the front surface and the back surface. A polycrystalline silicon film with a larger grain size can be obtained by, during the laser irradiation, applying a strong light by means of a lamp 804 to an area of the substrate 802 that is being irradiated with laser. As shown in FIG. 8, two belt conveyers 901 can be used instead of the cylindrical shape rollers 801, and the laser can be entered from a space between these belt conveyers.

The laser irradiation apparatus according to the present invention is applicable not only to the non-single crystal silicon film, but also to other non-single crystal semiconductor films. For example, it is also applicable to non-single crystal semiconductor films such as germanium or diamond.

Further, although the present specification is mainly about the linear shape laser beam, the effects indicated by the present invention can be similarly attained with a so-called surface shape beam which has an aspect ratio of approximately between 1 and 2 digits. For example, by using a surface beam, particularly a surface beam from the France-Sopra SAELC with which a large surface area beam can be obtained, to simultaneously irradiate a laser from the front and the back surface of the a-Si film, about 20 $cm^2$ of the surface area can be crystallized in one time.

Embodiment 1

An example of laser annealing an amorphous silicon film is shown here in Embodiment 1.

A 0.7 mm thick Corning 1737 is used as a substrate. This substrate has sufficient durability up to a temperature of 600°

C. A 200 nm SiO$_2$ film is deposited on one surface of the substrate. In addition, a 55 nm a-Si film is deposited on top. Plasma CVD is used for both film depositions. Other means of film deposition, such as sputtering, can be employed.

The substrate, on which the above films have been deposited, is exposed in a nitrogen atmosphere at 500° C. for 1 hour. This process is one for reducing the concentration of hydrogen in the a-Si film. Accordingly, the characteristic of the a-Si film to withstand laser can be raised immensely. A hydrogen concentration on the order of 10$^{20}$ atoms/cm$^3$ in the film is suitable.

Next, the substrate 703 is placed in a chamber 707 as shown in FIG. 6. The substrate is arranged in a direction parallel to gravity and fixed in place by fastening the top and bottom edges of the substrate from the front and back surface with the supporting tools 701. Note that in FIG. 6, 704 denotes the a-Si film and the SiO$_2$ film is omitted.

The substrate 703 is moved in the vertical direction of the drawing by moving mechanisms 702 within the defined space. In addition, moving mechanisms 709 moves the substrate along the depth of the defined space. Due to the moving mechanisms 702 and 709, the linear shape beam can be irradiated to the entire surface of the substrate. For the moving mechanisms 702 and 709, one using a ball screw or one using a linear motor can be used.

Figure 13:
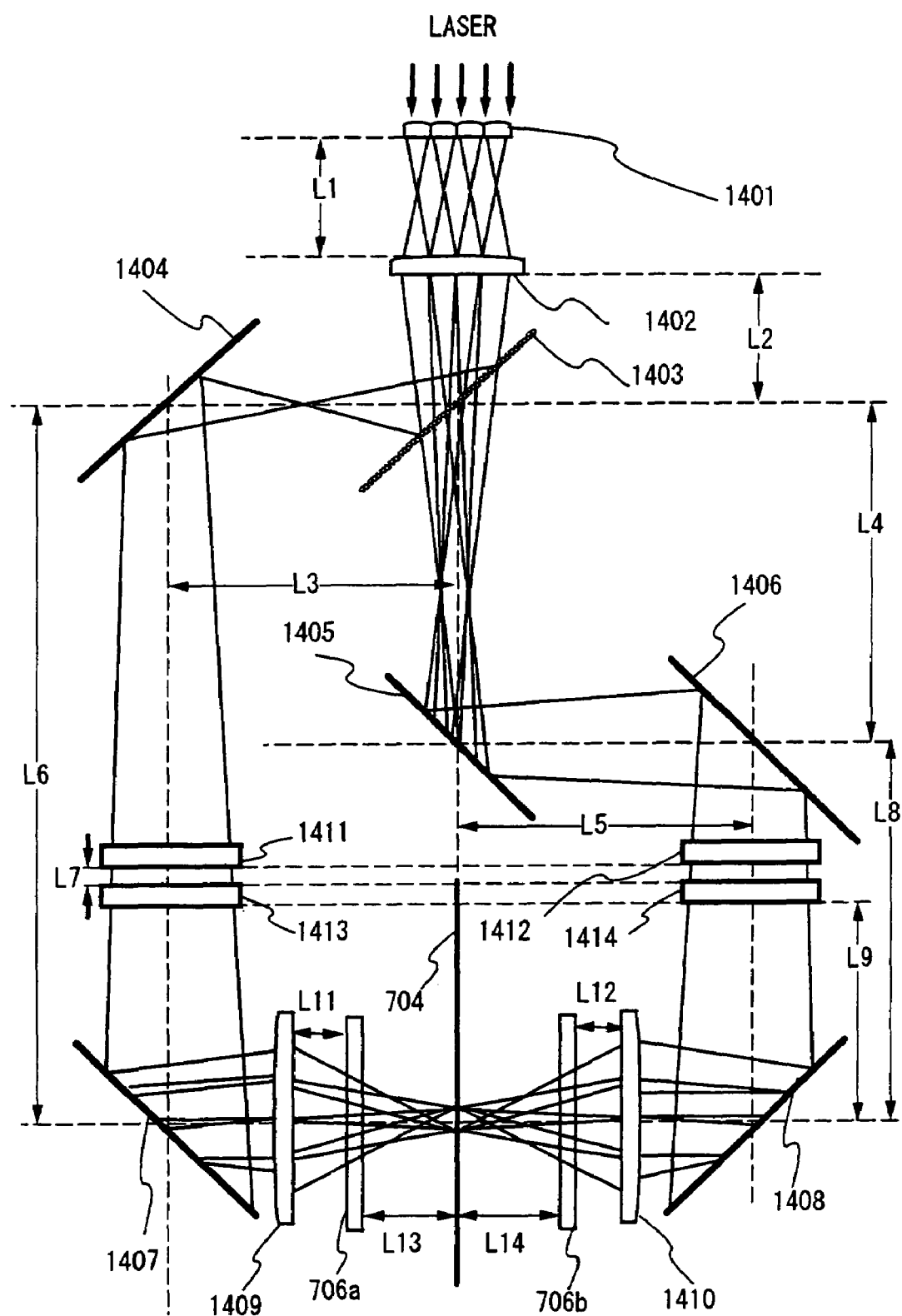
FIG. 13 is a diagram showing an optical system of a laser irradiation apparatus.

The laser beam is processed into two linear shape beams that are 270 mm long and 0.3 mm wide by an optical system shown in FIG. 13. The optical system shown in FIG. 13 is one example, and therefore the present invention is not limited to the numerical values indicated in this embodiment. Each beam is imaged onto the a-Si film 704 in a line shape via quartz windows 706a and 706b. The above numerals (sizes) are the sizes of the beam when it is imaged.

The specific sizes, the focal lengths, and the positional relationships of each of the lens of the optical system indicated in FIG. 13 are listed below. Quartz is used for the principal materials of the optical system.

A cylindrical lens array 1401 is composed of four cylindrical lenses each having a focal length of 200 mm, a width of 1.8 mm, a length of 50 mm, and a central thickness of 2 mm. These lenses split the beam in a vertical direction.

A cylindrical lens 1402 has a focal length of 200 mm, a width of 50 mm, a length of 50 mm, and a central thickness of 5 mm. The above beam split in the vertical direction is condensed onto a surface by this lens at one point, and then split again since that surface is still in the middle of the light path.

A mirror 1403 is a half mirror having a transmittance of 50% and a reflectance of 50% to thereby divide the beam in two. Mirrors 1404, 1405, 1406, 1407, and 1408 fulfill the role of bending the light path of the beam. Cylindrical lenses 1409 and 1410 are of the same shape having a focal length of 170 mm, a width of 70 mm, a length of 270 mm, and a central thickness of 15 mm. The above beam split in the vertical direction is synthesized into one beam onto an irradiation surface by these cylindrical lenses. In addition, the quartz windows 706a and 706b are 15 mm thick.

Figure 14:
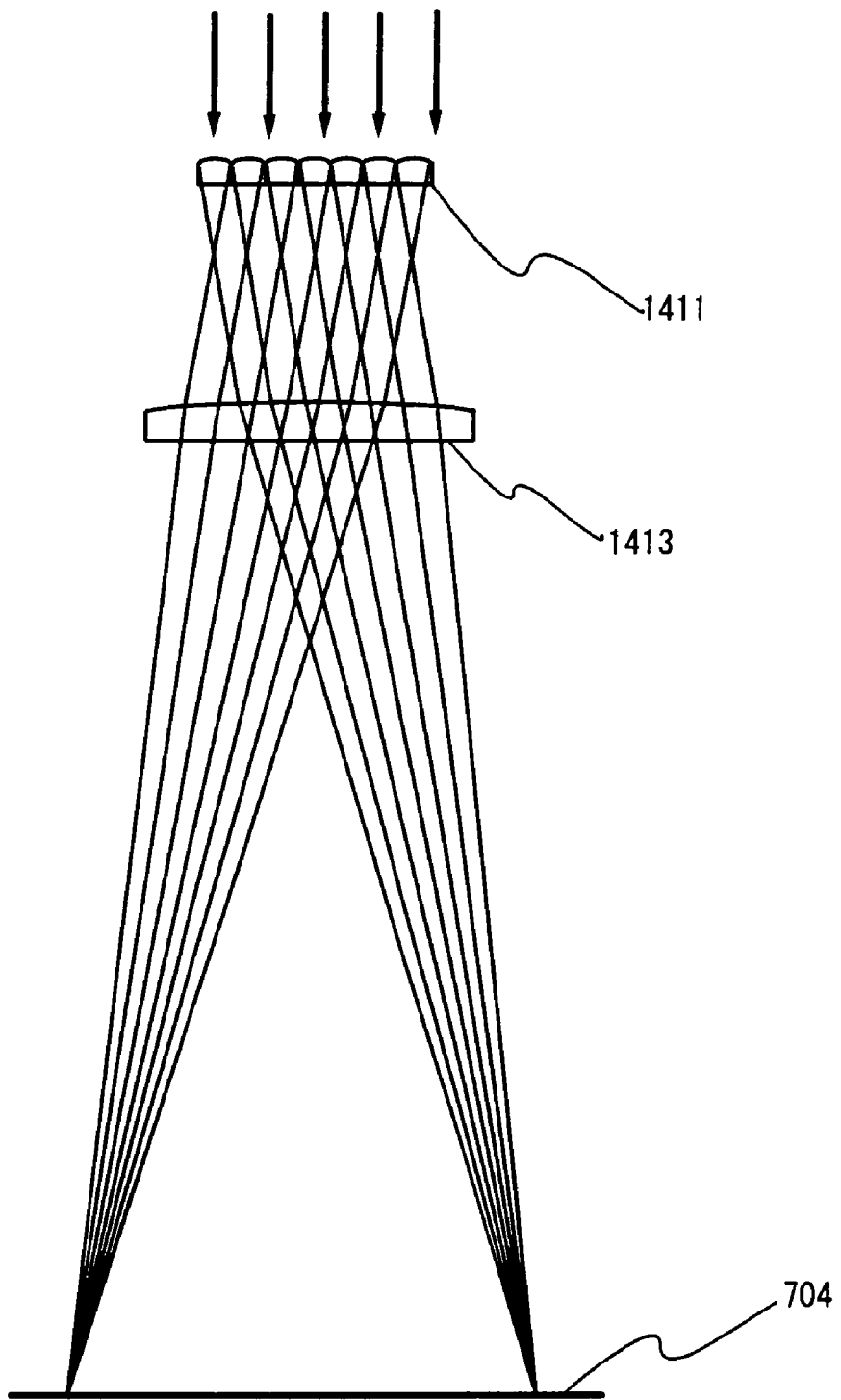
FIG. 14 is a diagram showing a partial structure of an optical system.

Cylindrical lens arrays 1411 and 1412 are of the same shape, composed of 7 cylindrical lenses each having a focal length of 200 mm, a width of 7 mm, a length of 50 mm, and a central thickness of 5 mm. These lenses split the beam in a horizontal direction. (refer to FIG. 14)

Cylindrical lenses 1413 and 1414 have a focal length of 770 mm, a width of 50 mm, a length of 50 mm, and a central thickness of 5 mm. The above beam split in the horizontal direction is synthesized into one beam onto the irradiation surface by these cylindrical lenses. (refer to FIG. 14)

The above stated lenses all have a curvature in the width direction. These lenses can be arranged according to FIG. 13. In other words, a length L1 between the cylindrical lens array 1401 and the cylindrical lens 1402 is set to 400 mm, and a length L2 between the cylindrical lens 1402 and the half mirror 1403 is set to 100 mm. The half mirror 1403 is arranged parallel to the longitudinal direction of the cylindrical lens 1402, and at 45 degrees to the width direction of the cylindrical lens 1402. Note that all the mirrors used in this optical system are arranged parallel to the longitudinal direction of the cylindrical lens 1402.

The mirror 1404 is arranged parallel to the half mirror 1403 to set an optical length L3 of the laser beam between the mirror 1404 and the half mirror 1403 to 400 mm. The mirror 1405 is arranged at right angles with the half mirror 1403 to set an optical length L4 of the laser beam between the half mirror 1403 and the mirror 1405 at 200 mm. The mirror 1406 is arranged parallel to the mirror 1405 to set an optical length L5 of the laser beam between the mirror 1405 and the mirror 1406 to 400 mm.

The mirror 1407 is arranged parallel to the mirror 1405 to set a length of the laser beam between the mirror 1404 and the mirror 1407 to 706 mm. Taking into consideration the material (quartz) and the thickness of the lenses 1411 and 1413, which are between the mirrors, 1404 and 1407, it is appropriate to set an optical length L6 between the mirrors 1404 and 1407 to 703 mm.

The mirror 1408 is arranged parallel to the mirror 1404 to set a length of the laser beam between the mirror 1406 and the mirror 1408 to 506 mm. Taking into consideration the material (quartz) and the thickness of the lenses 1412 and 1414, which are between the mirrors, 1406 and 1408, it is appropriate to set an optical length L8 between the mirrors 1406 and 1408 to 503 mm.

In addition, an optical length L7 between the cylindrical lens array 1411 (1412) and cylindrical lens 1413 (1414) is set to 40 mm, in the direction the laser beam enters.

The cylindrical lens 1413 and the cylindrical lens 1414 are respectively arranged at a point where the optical length is 770 mm from an irradiation surface 704. Accordingly, an optical length L9 between the mirror 1408 and the cylindrical lens 1414 is set at 370 mm, optical lengths L13 and L14 between the irradiation surface 704 and the quartz window 706a (706b) are set to 156 mm, and optical lengths L11 and L12 between the quartz windows 706a, 706b, and the cylindrical lens 1409 (1410) are set to 20 mm.

For the case of changing the size of a beam, adjust the focal length and size of the respective optical members shown in FIGS. 2 and 13 in accordance with those given by geometrical optics.

The transmittance and the reflectance of the half mirror 1403 of FIG. 13 are 50%, respectively, in Embodiment 1. The ratio of the energy of the two linear shape beams can be changed by altering the transmittance (or reflectance) of the half mirror.

If the energy distribution in the longitudinal direction of the above linear shape beam is within ±5%, then homogeneous crystallization of the a-Si film can be performed. With the energy distribution preferably within ±3%, more preferably within ±1%, more homogeneous crystallization can be performed. The number of cylindrical lens of the cylindrical lens array 1401, 1411, and 1412 can be increased in order to make energy distribution uniform.

In the embodiments throughout the present specification, the cylindrical lens array 1401 is composed of 4 cylindrical lenses, and the cylindrical lens arrays 1411 and 1412 are composed of 7 cylindrical lenses, respectively. This structure made it possible to suppress the energy distribution in the longitudinal direction of the above linear shape beam within ±5%.

For laser apparatus, a XeCl excimer laser is used. The maximum energy is 1000 mJ/pulse. Since each of the linear shape beams is 0.8 cm² in area, the maximum energy density of the linear shape beam that can be obtained is 500 mj/cm² or greater.

Figure 5:
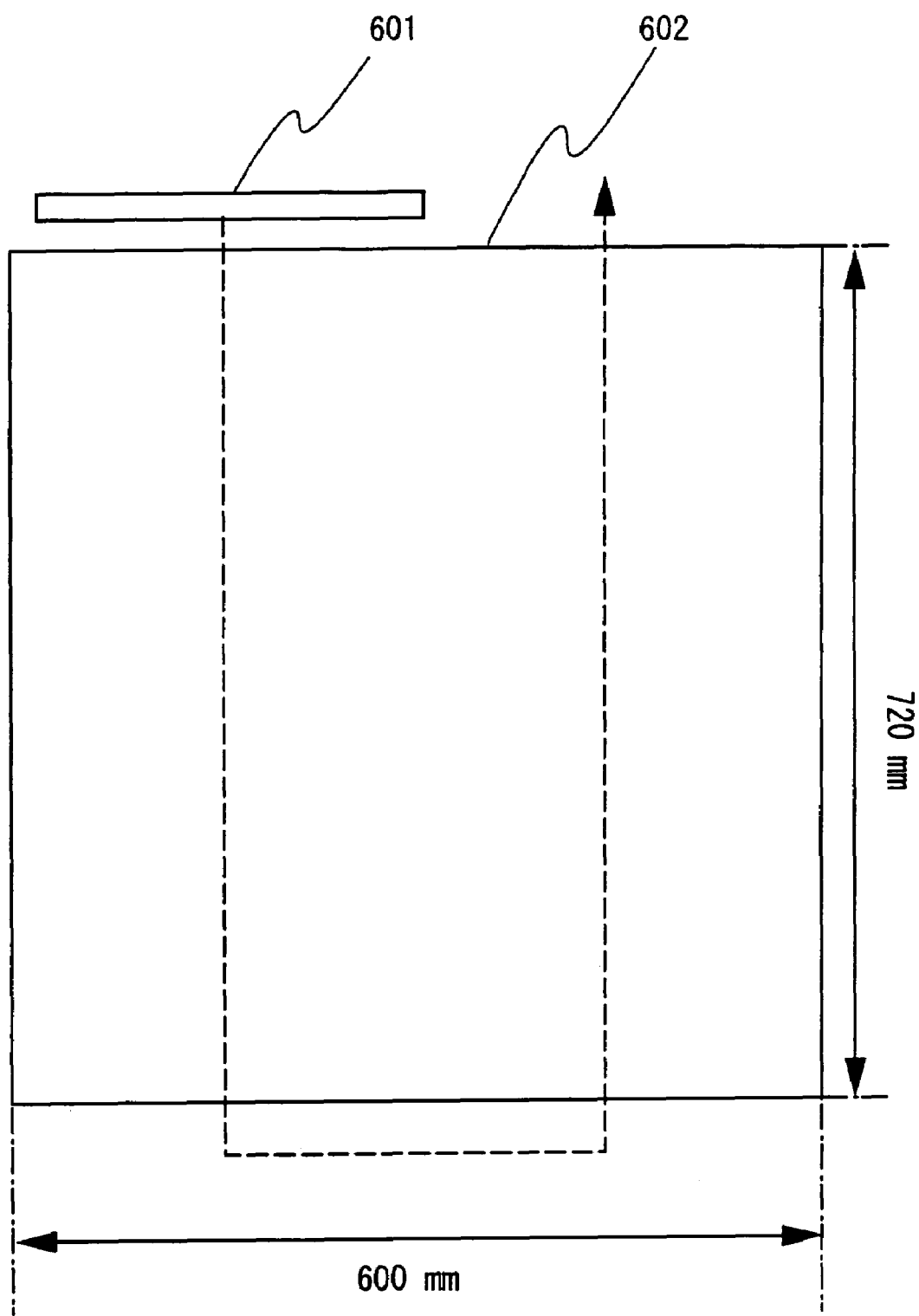
FIG. 5 is a diagram showing a scanning method of a laser beam.

The a-Si film 704 is crystallized by using this laser irradiation apparatus. Since the length of the beam is 270 mm with respect to the 600 mm×720 mm substrate 602, it is possible to irradiate the laser on almost the entire surface of the substrate by scanning, for example, the path shown in FIG. 5 with the laser beam 601.

The irradiation conditions of Embodiment 1 is as follows:
Energy density of laser: 190 mJ/cm² for both linear shape beams
Repetition frequency of laser: 40 Hz
Moving speed of substrate: 1 mm/s
Internal atmosphere of the chamber 707: high vacuum ($10^{-3}$ Pa)

A vacuum pump 708 as shown in FIG. 6 performs the controlling of the pressure. The combination of a dry pump and a turbo molecular pump is employed as the vacuum pump. The above conditions depend on the pulse width of the laser apparatus and the state of the film to be irradiated with a laser. Accordingly, an operator must take these into consideration to appropriately determine the conditions.

The atmosphere of the laser irradiation need not be high vacuum as stated above, but can be replaced by $H_2$. The replacement of the atmosphere is performed mainly to prevent contamination of the substrate. Gas is supplied through a gas cylinder 710 as shown in FIG. 6. The above atmosphere can also be $H_2$, He, $N_2$, or Ar, or a gaseous mixture thereof. Additionally, if the laser irradiation apparatus is set in a clean room, then the atmosphere can be air.

During laser irradiation, if infrared light, other than the laser beam, is irradiated by means of an infrared lamp 705 to the area of the a-Si film 704 that is irradiated by the laser to heat it, then improvement can be made on the uniformity of the grain size of the polycrystalline silicon film.

Due to the infrared lamp 705, the substrate temperature is set from the range of room temperature (10° C.) to 500° C. Although effects can be obtained from all the temperatures within the above temperature range, it is preferred that heating be performed in the range of 200° C. to 450° C. to thereby obtain a polycrystalline silicon film with a more uniform and larger grain size. At this point, it is appropriate for the temperature variation of the area irradiated by laser to be ±2 degrees.

The transmittance of the half mirror 1403 of FIG. 13 is 50% in Embodiment 1. However, the transmittance can be optimized by the operator between 20% and 80%. Due to this, the ratio of the energy of the linear shape beam irradiated from the front surface of the substrate and the energy of the linear shape beam irradiated from the back surface of the substrate can be regulated between 2:8 and 8:2. In order to obtain a more uniform and larger grain size of the polycrystalline silicon film, it is appropriate to adjust the ratio of the energy of the linear shape beam irradiated from the front surface of the substrate and the energy of the linear shape beam irradiated from the back surface of the substrate between 6:4 and 8:2.

In addition, though the XeCl excimer laser was used as the laser apparatus, other high output lasers may be utilized. Needless to say to say at this point, a laser light that transmits through a glass substrate is used. Also, examples of usable glass substrates other than the Corning 1737 include the Corning 705.

Embodiment 2

An example of a polycrystalline silicon film irradiated with a laser is shown here in Embodiment 2.

A 0.7 mm thick Corning 1737 is prepared as a substrate. This substrate has sufficient durability up to a temperature of 600° C. A 200 nm $SiO_2$ film is deposited on one side of the substrate. In addition, a 55 nm thick a-Si film is deposited on top. Plasma CVD is used for both film depositions. Other means of film deposition, such as sputtering, can be employed.

First, an aqueous nickel acetate solution with a concentration of 10 ppm is applied on the a-Si film, and then exposed to a nitrogen atmosphere at 550° C. for 4 hours, performing crystallization of the amorphous silicon film. Spin coating may be used as the application method. The amorphous silicon film doped with nickel by this technique is crystallized at a low temperature over a short time. It is thought that the cause of this is that the nickel fulfills the role of a crystal growth nucleus, promoting the crystal growth.

There are many defects included in the polycrystalline silicon film crystallized by the above method due to the low crystallization temperature, and there are cases in which it is insufficient for use as a semiconductor element material. Thus, in order to increase the crystallization of the polycrystalline silicon film, the film is irradiated with a laser beam by the laser irradiation apparatus shown in FIG. 6.

Embodiment 3

Embodiment 3 shows an example of employing an optical system different from the optical system indicated in the embodiment modes of the present invention. The modified optical system is explained with reference to FIG. 4.

Figure 4:
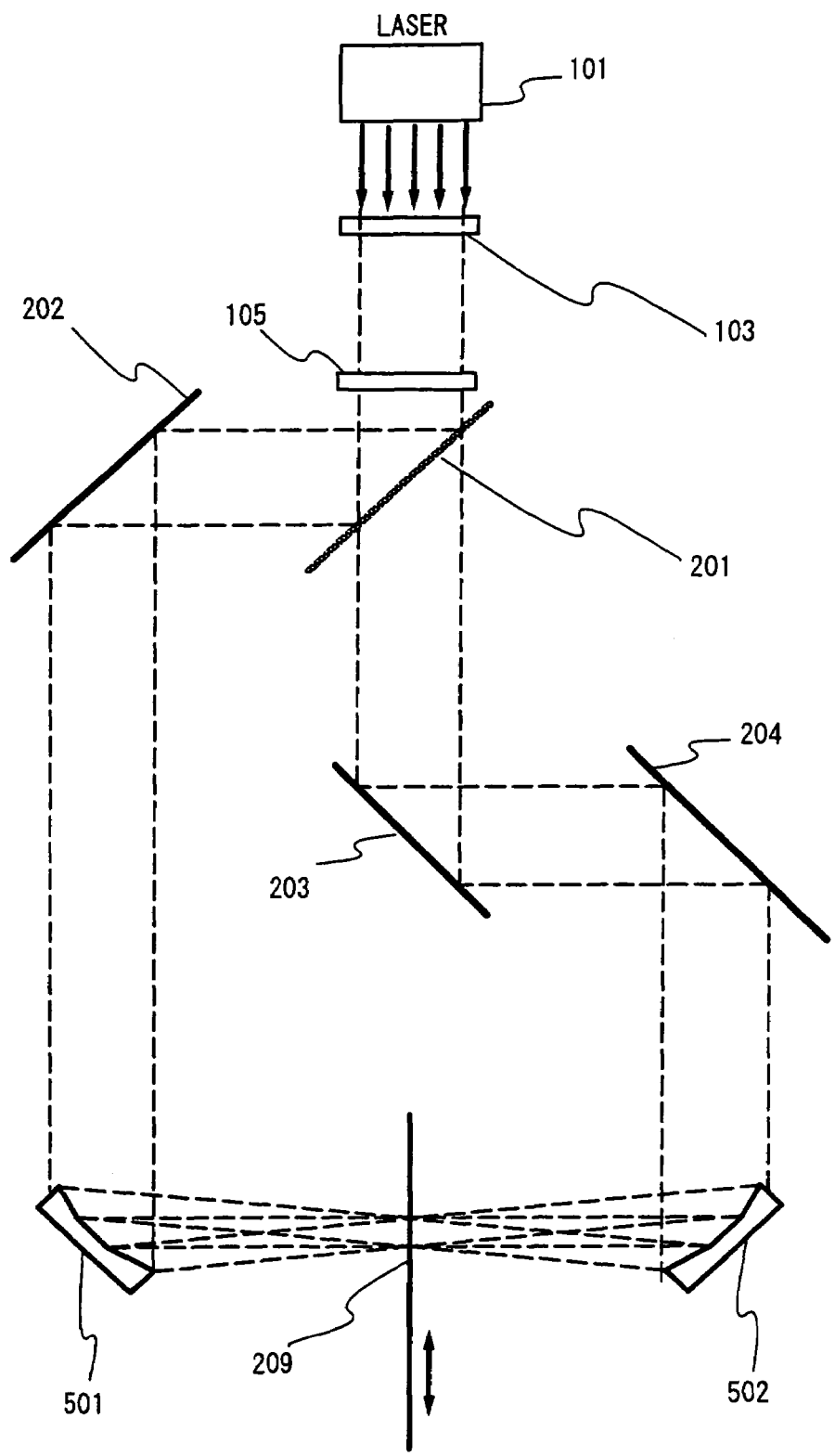
FIG. 4 is a diagram showing an optical-system of a laser irradiation apparatus.

The optical system of FIG. 4 is similar to that of FIG. 2 in that a laser is irradiated from the front surface and the back surface of a substrate. The symbols that are the same as those of FIG. 2 denote the same members.

A laser beam emitted from the laser oscillator 101 is split by the cylindrical lens array 103, and synthesized on the irradiation surface 209 by the cylindrical lens 105. The details of this structure are mentioned in the explanation of FIG. 1. This makes energy in the longitudinal direction of the linear shape laser beam on the irradiation surface uniform and determines its length.

On the other hand, the uniformity of the energy of the linear shape laser in the width direction is attained by reflection mirrors 501 and 502 having reflecting surfaces. The reflection mirrors 501 and 502 also determine the width of the linear shape laser at the same time.

The plural number of reflecting surfaces composing the reflection mirrors 501 and 502 are designed such that the light reflected to each and every surface are condensed at the same surface, in this case, the irradiation surface 209. This type of lens is generally called a lenticular lens. The angles of the reflecting surfaces of these lenses and their sizes are determined by a desired size of the beam irradiated to the irradiation surface. These values may be in accordance with those given by geometrical optics.

Embodiment 4

An example of performing laser irradiation to a substrate arranged in a horizontal state is shown here in Embodiment 4. For the case of positioning the substrate horizontally, it is not necessary to support the substrate. Therefore, the method has conventionally been employed. However, the present invention must irradiate a laser simultaneously from the front and the back surface of the substrate, thus a special contrivance is necessary.

FIG. 7 shows a stage for the laser irradiation apparatus. The cylindrical shape rollers 801 are arranged parallel to one another and the substrate 802 is placed thereon. The cylindrical shape rollers 801 rotate at equal speed with each other whereby the substrate is moved in a left and right direction of the defined space. Symbol 803 denotes a non-single crystal semiconductor film formed on the surface of the substrate 802.

The laser beam is simultaneously irradiated from the front surface and the back surface of the substrate 802. Because the cylindrical shape rollers 801 are used as the stage, gaps, through which laser can pass through, are formed in the back surface of the substrate. Accordingly, the laser beam can be irradiated from the front surface and the back surface.

In addition, the infrared lamp 804 is provided for application of infrared light to the laser-irradiated area when laser irradiation is being performed so that this area may be heated.

As shown in FIG. 8, two belt conveyors 901 may be used instead of the rollers 801. Thus, laser may also be entered from the gaps of the belt conveyors 901. In FIG. 8, the symbols that are the same as those of FIG. 7 denote the same members.

FIG. 8 shows a structure in which atmosphere controlling is possible during laser irradiation. The substrate may be taken in/out through an unillustrated vacuum gate provided in a chamber 902. A vacuum pump 904 is connected to the chamber 902 to make the atmosphere high vacuum. The combination of a dry pump and a turbo molecule pump is employed as the vacuum pump 904. With this structure, the degree of vacuum may be lowered until $10^{-3}$ Pa.

If laser irradiation is performed with the degree of vacuum reduced, then laser irradiation with less contamination can be performed to the substrate. Further, with the same object in mind, controlling the atmosphere of the chamber can also prevent contamination of the substrate.

The atmosphere of the laser irradiation need not be such as the above high vacuum, but can be $H_2$, He, $N_2$, Ar, or a gaseous mixture thereof. These gases are supplied to the chamber 902 from a gas cylinder 905.

Embodiment 5

An example of irradiating a beam of the same shape and equal size from the front surface and the back surface of a substrate has been shown in the above stated Embodiments. Embodiment 5 shows an example of a beam irradiated from the front surface and the back surface of a substrate differing in size with each other.

This embodiment shows an example of obtaining a much larger crystal grain size of a polycrystalline silicon film by making the width of the beams in the substrate advancing direction different with each other at the front surface and the back surface of the substrate.

Figure 9:
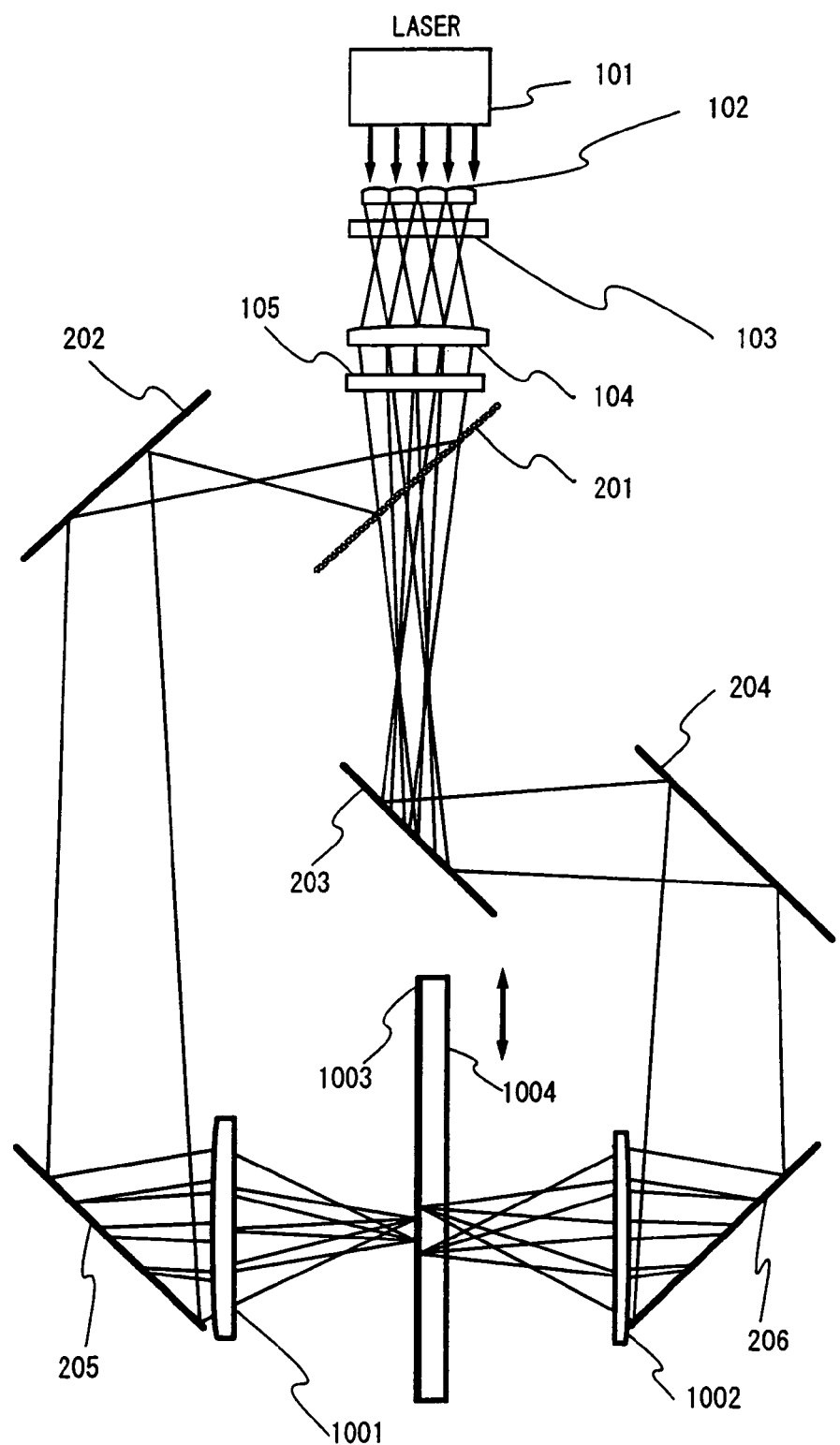
FIG. 9 is a diagram showing an optical system of a laser irradiation apparatus.

An optical system realizing such beam is shown in FIG. 9. The optical system of FIG. 9 is a modified version of FIG. 2. In FIG. 9, the cylindrical lenses 207 and 208 of FIG. 2 are replaced with cylindrical lenses 1001 and 1002. Note that the symbols in FIG. 9 that are the same as those of FIG. 2 denote the same members. Reference symbol 1004 denotes a substrate, and reference symbol 1003 denotes a non-single crystal semiconductor film formed on the surface of the substrate.

The cylindrical lenses 207 and 208 are identical in shape for the purpose of irradiating the substrate with identical laser beams from the front surface and the back surface of the substrate. In other words, the cylindrical lenses 207 and 208 have the same focal lengths.

In contrast to this, the focal lengths of the cylindrical lenses 1001 and 1002 are different. In FIG. 9, in the case of wanting to make wider the width of a beam irradiated from the back surface of the substrate in comparison with the width of a beam irradiated from the front surface (the side of the non-single crystal silicon film 1003), then make the focal length of the cylindrical lens 1002 longer than the focal length of the cylindrical lens 1001. In addition, the length from the non-single crystal silicon film 1003 to the cylindrical lens 1002 is made longer than the length from the non-single crystal silicon film 1003 to the cylindrical lens 1001.

When designing the above structure in practice, the optical placements may be in accordance with those given by geometrical optics. A specific example is explained using FIG. 13. The focal length of the cylindrical lens 1410 of FIG. 13 is 200 mm. If this position, from the example of FIG. 13, is shifted 43 mm in the direction the laser beam enters, then the width of the linear shape laser beam formed by the cylindrical lens 1410 on the irradiation surface 704 becomes 0.4 mm. The width of the linear shape laser beam formed by the cylindrical lens 1409 is 0.3 mm. Therefore, laser beams with different widths can be formed.

The grain size of the polycrystalline silicon film that can be obtained can be made further larger if the width of the beam from the back surface of the substrate is made wider than the width of the beam from the front surface of the substrate. Note that the direction of the width of the beam and the scanning direction of the beam to the substrate specified here are parallel with each other.

Figure 12:
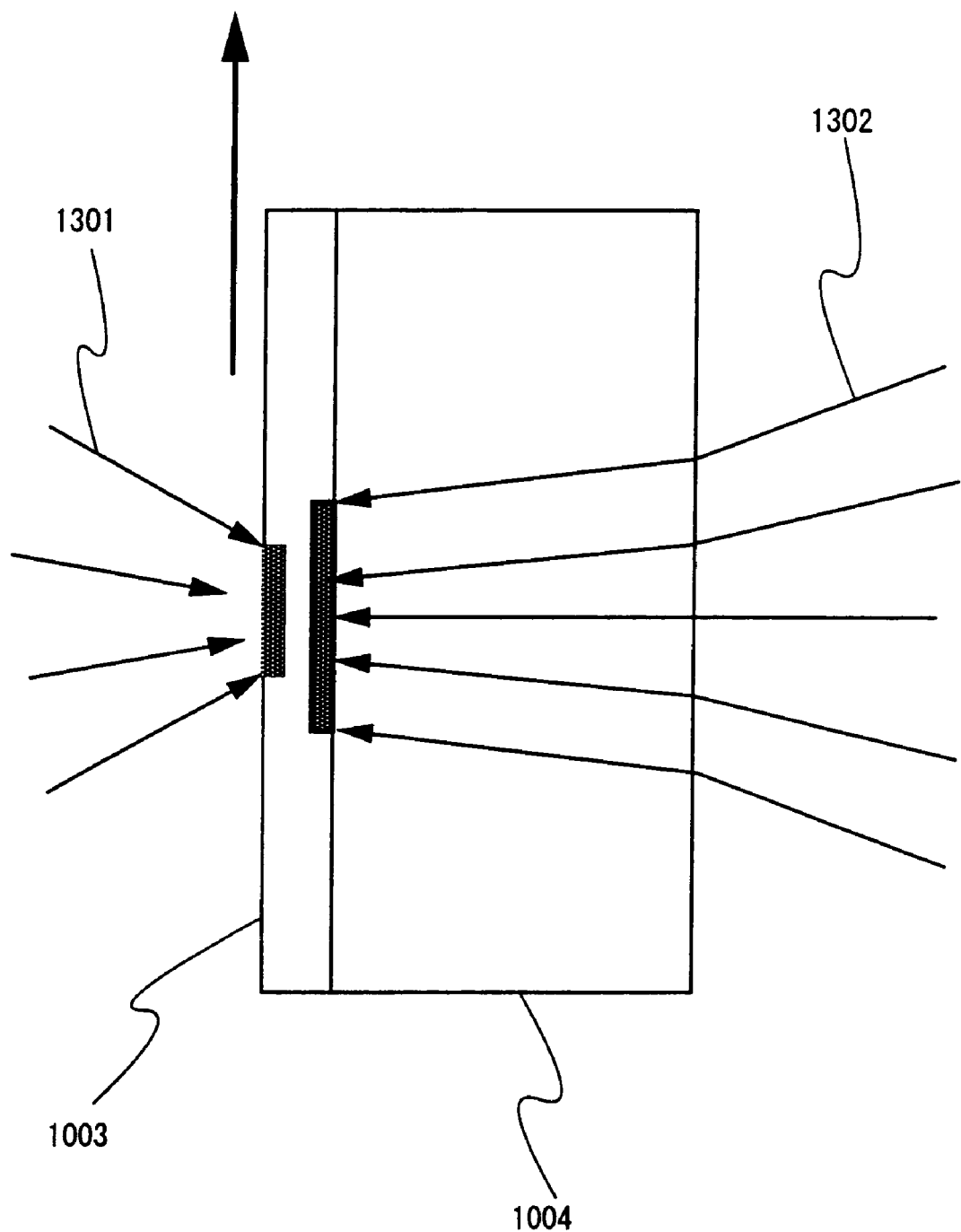
FIG. 12 is a diagram showing a sectional view of a linear shape beam on a surface to be irradiated.

The state of the beam at the irradiation surface is shown in FIG. 12. The beam width of a beam 1301 entered from the front surface (the side of the non-single crystal silicon film 103) of a substrate 1004 is narrower than the beam width of a beam 1302 entered from the back surface of the substrate 1004. Also, the scanning direction of the laser to the substrate is parallel with the beam width.

Embodiment 6

Another example of a beam irradiated from the front surface and the back surface of a substrate differing in size with each other is shown here in Embodiment 6.

Figure 10:
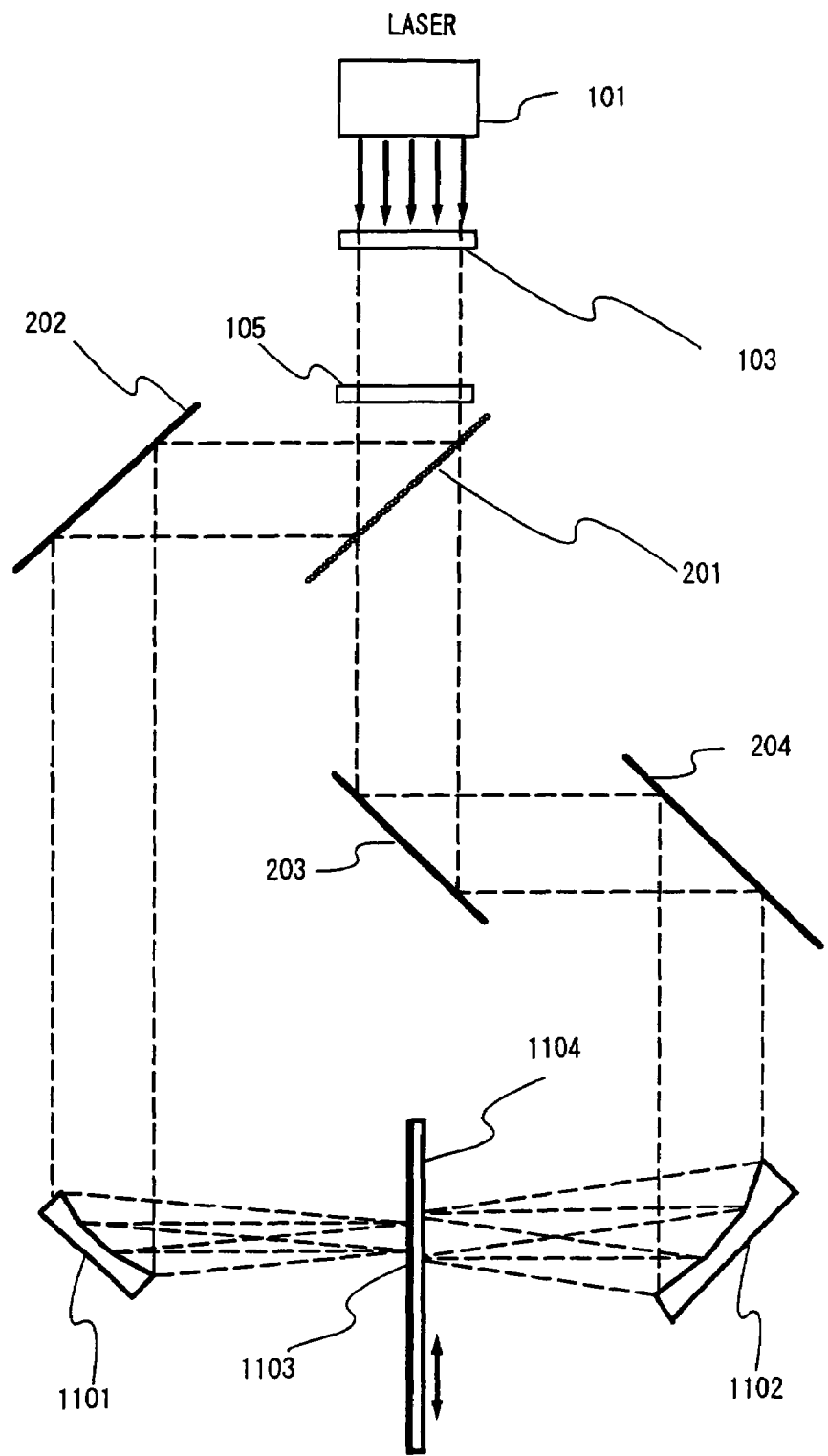
FIG. 10 is a diagram showing an optical system of a laser irradiation apparatus.

The process indicated in Embodiment 4 can be performed with a structure utilizing the lenticular lens indicated in Embodiment 3. In FIG. 4, the lenticular lenses 501 and 502 have identical shapes. However, if a beam differing in size is to be irradiated from the front surface and the back surface of a substrate as in this embodiment, then it is essential to differ the shapes of the lenticular lens from each other as indicated in FIG. 10.

For example, in the case of wanting to make the width of the beam irradiated from the back surface of the substrate (the side of the substrate 1104) wider than the width of the beam irradiated from the front surface of the substrate (the non-single crystal silicon film 1103), each of the plurality of surfaces of the mirrors composing a lenticular lens 1102 is made larger than those of a lenticular lens 1101.

When designing the above structure in practice, the optical placements may be in accordance with those given by geometrical optics. The grain size of a polycrystalline silicon film that may be obtained can be made much larger by making the width of the beam from the back surface of the substrate larger than the width of the beam from the front surface of the substrate. Note that the direction of the width of the beam and the scanning direction of the beam to the substrate specified here are parallel with each other.

Embodiment 7

Figure 11:
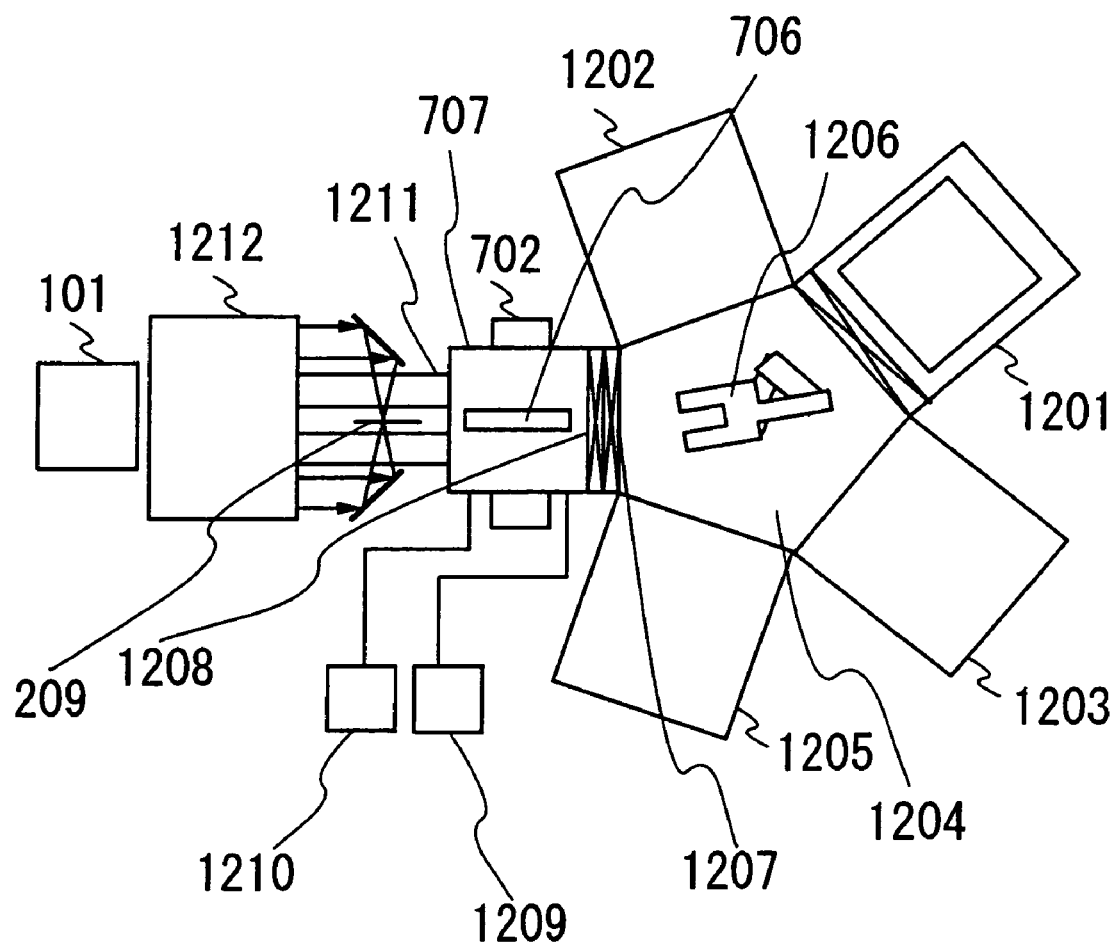
FIG. 11 is a diagram showing a laser irradiation apparatus

Referring to FIG. 11, an example of a laser irradiation apparatus for mass production is shown here in Embodiment 7.

Using a robot arm 1206 for conveyance installed in a transfer chamber 1204, a substrate is transported from a load/unload chamber 1201. First, the substrate is transported to a preheat chamber 1203 after positioning is made in an alignment chamber 1202. Then using, for example, an infrared lamp heater, the temperature of the substrate is heated in advance to a desired temperature, for example, approximately 300° C. here. Thereafter, the substrate is fixedly placed in a laser irradiation chamber 707 passing through gate valves 1207 and 1208. At this point, the edges of the substrate are fastened with the substrate supporting tools indicated in FIG. 6 to thereby fix the substrate in place.

The gate valves 1207 and 1208 are then closed, and separated from each other by a laser irradiation chamber transferring mechanism 1211. The laser irradiation chamber transferring mechanism 1211 is structured with a mechanism to rotate the laser irradiation chamber. Due to this, the substrate can be in an upright position against gravity. The laser irradiation chamber transferring mechanism 1211 transports the substrate, as such, in the upright state, to the irradiation position of the laser beam.

After being emitted from the laser oscillator 101, the laser beam is processed into two linear shape beams at the irradiation surface 209 via a laser optical system 1212. The laser beam is irradiated on the substrate through the quartz window 706. The above stated optical system may be used as the laser optical system 1212. Or, an optical system with a structure conforming to the optical system mentioned above may also be employed.

The atmosphere of the laser irradiation chamber 707 is drawn (raised) to the high vacuum level ($10^{-3}$ Pa) using a vacuum pump 1209 before laser irradiation. Or, create a desired atmosphere using the vacuum pump 1209 and a gas cylinder 1210. As stated earlier, the atmosphere can be Ar and $H_2$, or a gaseous mixture thereof. Thereafter, while irradiating the laser, the substrate is scanned due to the moving mechanism 702, to thereby irradiate the laser on the substrate. At this time, an infrared lamp may be applied to the portion that is laser irradiated.

After laser irradiation, the substrate is transported to a cooling chamber 1205 where it is slowly cooled and then returned back to the load/unload chamber via the alignment chamber 1202.

Many substrates can be laser treated by repeating this chain of procedures.

Embodiment 8

The present embodiment is described by using FIGS. 15 to 21. Here, the method of fabricating pixel TFTs for the display region and TFTs of driving circuits provided in the periphery of the display region, over a substrate, and a display device manufactured by using it will be described in detail in accordance with the fabricating steps. However, in order to simplify the description, CMOS circuits that are the basic circuits of a shift register circuit, a buffer circuit, and the like for the driver circuit and n-channel type TFTs that form sampling circuits will be shown in the figures.

In FIG. 15A, a low-alkaline glass substrate or a quartz substrate can be used as a substrate 1501. In this embodiment, a low-alkaline glass substrate was used. On the surface of this substrate 1501 on which TFTs are to be formed, a base film 1502 such as a silicon oxide film, a silicon nitride film or a silicon oxynitride film is formed in order to prevent the diffusion of impurities from the substrate 1501. For example. a silicon oxynitride film which is fabricated from $SiH_4$, $NH_3$, $N_2O$ by plasma CVD into 100 nm and a silicon oxynitride film which is similarly fabricated from $SiH_4$ and $N_2O$ into 200 nm are formed into a laminate.

Next, a semiconductor film 1503a that has an amorphous structure and a thickness of 20 to 150 nm (preferably, 30 to 80 nm) is formed by a known method such as plasma CVD or sputtering. In this embodiment, an amorphous silicon film was formed to a thickness of 55 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the base film 1502 and the amorphous silicon film 1503a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 15A)

Then, by a known crystallization technique, a crystalline silicon. film 1503b is formed from the amorphous silicon film 1503a. In the present Embodiment laser crystallization was performed in accordance with the above stated Embodiment 1 by using a laser apparatus of the invention. It is preferred that, prior to the crystallization step, heat treatment is carried out at 400 to 500° C. for about one hour though it depends on the amount of hydrogen contained, so that, after the amount of hydrogen contained is reduced to 5 atomic % or less, the crystallization is carried out. (FIG. 15B)

Then, the crystalline silicon film 1503b is divided into islands, to form island semiconductor layers 1504 to 1507. Thereafter, a mask layer 1508 of a silicon oxide film is formed to a thickness of 50 to 100 nm by plasma CVD or sputtering. (FIG. 15C)

Then, a resist mask 1509 is provided, and, into the whole surfaces of the island semiconductor layers 1505 to 1507 forming the n-channel type TFTs, boron (B) was added as an impurity element imparting p- type conductivity, at a concentration of about $1\times10^{16}$ to $5\times10^{17}$ atoms/$cm^3$, for the purpose of controlling the threshold voltage. The addition of boron (B) may be performed either by the ion doping or it may be added simultaneously when the amorphous silicon film is formed. The addition of boron (B) here was not always necessary, however, the formation of semiconductor layers 1510 to 1512 into which boron was added was preferable for maintaining the threshold voltage of the n-channel type TFTs within a prescribed range. (FIG. 15D)

In order to form the LDD regions of the n-channel type TFTs in the driving circuit, an impurity element imparting n-type conductivity is selectively added to the island semiconductor layers 1510 and 1511 . For this purpose, resist masks 1513 to 1516 were formed in advance. As the impurity element imparting the n-type conductivity, phosphorus (P) or arsenic (As) may be used; here, in order to add phosphorus (P), ion doping using phosphine ($PH_3$) was applied. The concentration of phosphorus (P) in the impurity regions 1517 and 1518 thus formed may be set within the range of from $2\times10^{16}$ to $5\times10^{19}$ atoms/$cm^3$. In this specification, the concentration of the impurity element contained in the thus formed impurity regions 1517 to 1519 imparting n-type conductivity is represented by ($n^-$). Further, the impurity region 1519 is a semiconductor layer for forming the storage capacitor of the pixel matrix circuit; into this region, phosphorus (P) was also added at the same concentration. (FIG. 16A)

Next, the mask layer 108 is removed by hydrofluoric acid or the like, and the step of activating the impurity elements added at the steps shown in FIG. 15D and FIG. 16A is carried out. The activation can be carried out by performing heat treatment in a nitrogen atmosphere at 500 to 600° C. for 1 to 4 hours or by using the laser activation method. Further, both methods may be jointly performed. Or, the laser irradiation described in the Embodiment 2 may be performed. In this embodiment, the laser activation method was employed, and a KrF excimer laser beam (with a wavelength of 248 nm) was used; the beam is formed into a linear beam; and scan was carried out under the condition that the oscillation frequency was 5 to 50 Hz, the energy density was 100 to 500 mJ/$cm^2$, and the overlap ratio of the linear beam was 80 to 98%, whereby the whole substrate surface on which the island semiconductor layers were formed. Any item of the laser irradiation condition is subjected to no limitation, so that the operator may suitably select the condition.

Then, a gate insulating film 1520 is formed of an insulating film comprising silicon to a thickness of 10 to 150 nm, by plasma CVD or sputtering. For example, a silicon oxynitride film is formed to a thickness of 120 nm. As the gate insulating film, other insulating films comprising silicon may be used as a single layer or a laminate structure. (FIG. 16B)

Next, in order to form a gate electrode, a first conductive layer is deposited. This first conductive layer may be formed of a single layer but may also be formed of a laminate consisting of two or three layers. In this embodiment, a conductive layer (A) 1521 comprising a conductive metal nitride film and a conductive layer (B) 1522 comprising a metal film are laminated. The conductive layer (B) 1522 may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) 1521 is formed of a tantalum nitride (TaN) film, a tungsten nitride (WN) film, a titanium nitride (tin) film, or a molybdenum nitride (MoN) film. Further, as the substitute materials of the conductive film (A) 1521, tungsten silicide, titanium silicide, and molybdenum silicide may also be applied. The conductive layer (B) may preferably have its impurity concentration reduced in order to decrease the resistance thereof; in particular, as for the oxygen concentration, the concentration may be set to 30 ppm or less. For example, tungsten (W) could result in realizing a resistivity of 20 μΩcm or less by rendering the oxygen concentration thereof to 30 ppm or less.

The conductive layer (A) 1521 may be set to 10 to 50 nm (preferably, 20 to 30 nm), and the conductive layer (B) 1522 may be set to 200 to 400 nm (preferably, 250 to 350 nm). In this embodiment, as the conductive layer (A) 1521, a tantalum nitride film with a thickness of 30 nm was used, while, as the conductive layer (B) 1522, a Ta film with a thickness of 350 nm was used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 1521. By doing so, the adhesiveness of the conductive film formed thereon can be enhanced, and at the same time, oxidation can be prevented. In addition, the alkali metal element slightly contained in the conductive layer (A) or the conductive layer (B) can be prevented from diffusing into the gate insulating film 1520. (FIG. 16C)

Next, resist masks 1523 to 1527 are formed, and the conductive layer (A) 1521 and the conductive layer (B) 1522 are etched together to form gate electrodes 1528 to 1531 and a capacitor wiring 1532. The gate electrodes 1528 to 1531 and the capacitor wiring 1532 are formed in such a manner that the layers 1528a to 1532a comprised of the conductive layer (A) and the layers 1528b to 1532b comprised of the conductive layer (B) are respectively formed integrally. In this case, the gate electrodes 1529 and 1530 formed in the driving circuit are formed so as to overlap the portions of the impurity regions 1517 and 1518 through the gate insulating film 1520. (FIG. 16D)

Then, in order to form the source region and the drain region of the p-channel TFT in the driving circuit, the step of adding an impurity element imparting p-type conductivity is carried out. Here, by using the gate electrode 1528 as a mask, impurity regions are formed in a self-alignment manner. In this case, the region in which the n-channel TFT will be formed is coated with a resist mask 1533 in advance. Thus, impurity regions 1534 were formed by ion doping using diborane ($B_2H_6$). The concentration of boron (B) in this region is set at $3\times10^{20}$ to $3\times10^{21}$ atoms/$cm^3$. In this specification, the concentration of the impurity element imparting p-type contained in the impurity regions 1534 is represented by ($p^+$). (FIG. 17A)

Next, in the n-channel TFTs, impurity regions that function as source regions or drain regions were formed. Resist masks 1535 to 1537 were formed, and impurity regions 1538 to 1542 were formed by adding an impurity element for imparting the n-type conductivity. This was carried out by ion doping using phosphine ($PH_3$), and the phosphorus (P) concentration in these regions was set to $1\times10^{20}$ to $1\times10^{21}$ atoms/$cm^3$. In this specification, the concentration of the impurity element imparting the n-type contained in the impurity regions 1538 to 1542 formed here is represented by ($n^+$). (FIG. 17B)

In the impurity regions 1538 to 1542, the phosphorus (P) or boron (B) which was added at the preceding steps are contained, however, as compared with this impurity element concentration, phosphorus is added here at a sufficiently high concentration, so that the influence by the phosphorus (P) or boron (B) added at the preceding steps need not be taken into consideration. Further, the concentration of the phosphorus (P) that is added into the impurity regions 1538 is ½ to ⅓ of the concentration of the boron (B) added at the step shown in FIG. 17A; and thus, the p-type conductivity was guaranteed, and no influence was exerted on the characteristics of the TFTs.

Then, the step of adding an impurity imparting n-type is performed to form the LDD regions of the n-channel type TFTs in the pixel matrix circuit. Here, by using the gate electrode 1531 as a mask, the impurity element for imparting n-type was added in a self-alignment manner. The concentration of phosphorus (P) added was $1\times10^{16}$ to $5\times10^{18}$ atoms/$cm^3$; by thus adding phosphorus at a concentration lower than the concentrations of the impurity elements added at the steps shown in FIG. 16A, FIG. 17A and FIG. 17B, only impurity regions 1543 and 1544 were substantially formed. In this specification, the concentration of the impurity element for imparting the n-type conductivity contained in these impurity regions 1543 and 1544 is represented by (n⁻). (FIG. 17C)

Thereafter, in order to activate the impurity elements, which were added at their respective concentrations for imparting n-type or p-type conductivity, a heat treatment step was carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., typically at 500 to 600° C.; in this embodiment, the heat treatment was carried out at 550° C. for 4 hours. Further, in the case a substrate such as a quartz substrate which has heat resistance is used as the substrate 1501, the heat treatment may be carried out at 800° C. for one hour; in this case, the activation of the impurity elements and the junctions between the impurity regions into which the impurity element was added and the channel forming region could be well formed.

By this heat treatment, on the metal films 1528b to 1532b, which form the gate electrodes 1528 to 1531 and the capacitor wiring 1532, conductive layers (C) 1528c to 1532c are formed with a thickness of 5 to 80 nm as measured from the surface. For example, in the case the conductive layers (B) 1528b to 1532b are made of tungsten (W), tungsten nitride (WN) is formed; in the case of tantalum (Ta), tantalum nitride (TaN) can be formed. Further, the conductive layers (C) 1528c to 1532c can be similarly formed by exposing the gate electrodes 1528 to 1531 to a plasma atmosphere containing nitrogen using nitrogen, ammonia or the like. Further, heat treatment was carried out in an atmosphere containing 3 to 100% of hydrogen at 300 to 450° C. for 1 to 12 hours, thus performing the step of hydrogenating the island semiconductor layers.

This step is a step for terminating the dangling bonds of the semiconductor layers by the thermally excited hydrogen. As another means for the hydrogenation, plasma hydrogenation (using the hydrogen excited by plasma) may be performed. (FIG. 17D)

After the activation and hydrogenation steps are over, a second conductive film is formed as gate wiring. This second conductive film is preferably formed of a conductive layer (D) comprised mainly of aluminum (Al) or copper (Cu) that is a low resistance material, and a conductive layer (E) comprised of titanium (Ti), tantalum (Ta), tungsten (W), or molybdenum (Mo). In this embodiment, the second conductive film was formed by using, as the conductive layer (D) 1545, an aluminum (Al) film containing 0.1 to 2 wt % of titanium (Ti), and by using a titanium (Ti) film as the conductive layer (E) 1546. The conductive layer (D) 1545 may be formed to a thickness of 200 to 400 nm (preferably, 250 to 350 nm), while the conductive layer (E) 1546 may be formed to a thickness of 50 to 200 nm (preferably, 100 to 150 nm). (FIG. 18A)

Then, in order to form gate wirings connected to the gate electrodes, the conductive layer (E) 1546 and the conductive layer (D) 1545 were etched, whereby gate wirings 1547 and 1548 and a capacitor wiring 1549 were formed. The etching treatment was carried out in such a manner that, at first, by a dry etching method using a mixture gas of $SiCl_4$, $Cl_2$ and $BCl_3$, the portions extending from the surface of the conductive layer (E) to a part of the way of the conductive layer (D) were removed, and, thereafter, the conductive layer (D) was removed by wet etching using a phosphoric acid etching solution, whereby the gate wirings could be formed, maintaining a selective workability with respect to the base film.

A first interlayer insulating film 1550 is formed of a silicon oxide film or a silicon oxynitride film with a thickness of 500 to 1500 nm, and contact holes reaching the source regions or the drain regions, which are formed in the respective island semiconductor layers, are formed; and source wirings 1551 to 1554 and drain wirings 1555 to 1558 are formed. Though not shown, in this embodiment, these electrodes were formed from a laminate film of three-layer structure which was formed by successively forming by sputtering: a Ti film to 100 nm; an aluminum film containing Ti to 300 nm; and a Ti film to 150 nm.

Next, as a passivation film 1559, a silicon nitride film, a silicon oxide film or a silicon oxynitride film is formed to a thickness of 50 to 500 nm (typically 100 to 300 nm). In the case that a hydrogenating treatment was carried out in this state, a preferable result was obtained in respect of the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method was employed, a similar effect was obtained. Here, openings may be formed in the passivation film 1559 at the positions at which contact holes for connecting the pixel electrodes and drain wirings to each other will be formed later. (FIG. 18C)

Figure 19:
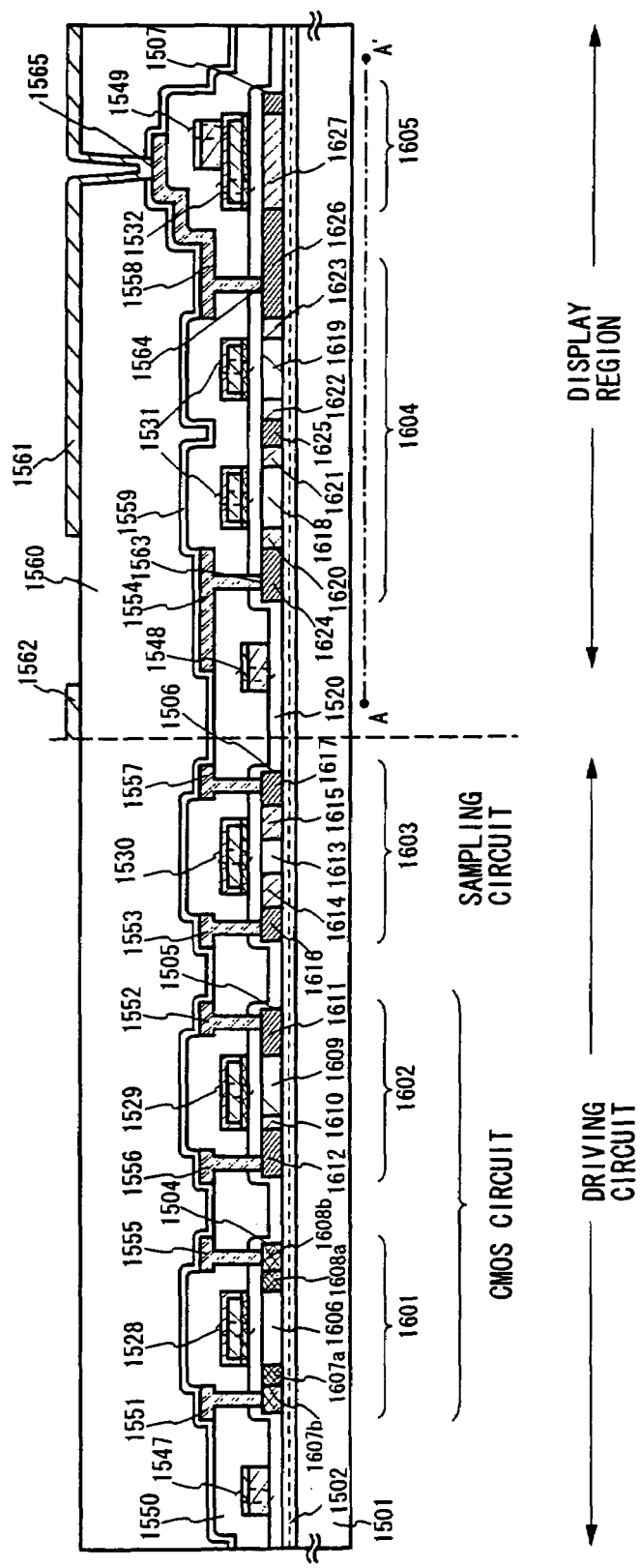
FIG. 19 is a diagram showing an example of a manufacturing process according to the present invention.

Thereafter, a second interlayer insulating film 1560 comprised of an organic resin is formed to a thickness of 1.0 to 1.5 μm. As the organic resin, polyimide, acrylic, polyamide, polyimideamide, or BCB (benzocyclobutene) can be used. Here, the second interlayer dielectric film was formed by using a polyimide of the type which thermally polymerizes after applied to the substrate, and it was fired at 300° C. Then, a contact hole reaching the drain wiring 1558 was formed in the second interlayer insulating film 1560, and pixel electrodes 1561 and 1562 were formed. The pixel electrodes may use a transparent conductive film in the case a transmission type liquid crystal display device is to be obtained, while, in the case a reflection type liquid crystal display device is to be fabricated, it may use a metal film. In this embodiment, a transmission type liquid crystal display device is to be fabricated, so that an indium tin oxide (ITO) film was formed to a thickness of 100 nm by sputtering. (FIG. 19)

In this way, a substrate having the TFTs of the driving circuit and the pixel TFTs of the display region on the same substrate could be completed. In the driving circuit, there were formed a p-channel TFT 1601, a first n-channel TFT 1602 and a second n-channel TFT 1603, while, in the display region, there were formed a pixel TFT 1604 and a storage capacitor 1605. In this specification, such a substrate is called active matrix substrate for convenience.

Figure 20:
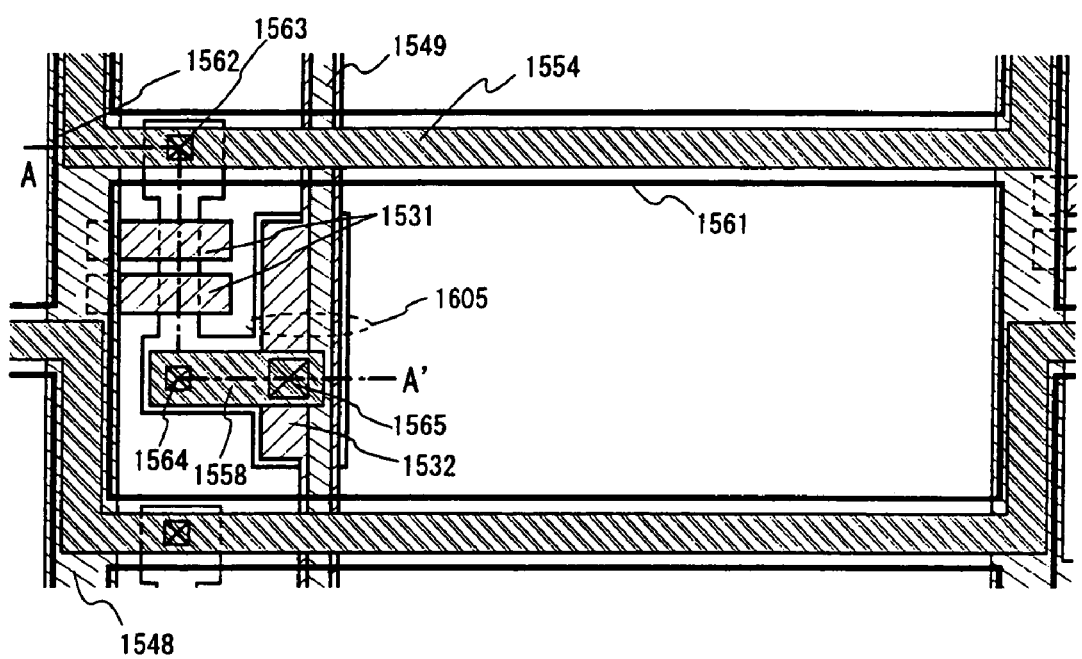
FIG. 20 is a diagram showing the top view of a pixel.

Note that FIG. 20 is a top view showing almost one pixel in the display region. The cross section along with A-A' shown in FIG. 20 corresponds to the cross sectional diagram of the display region shown in FIG. 19. Further, common reference numerals are used in FIG. 20 to correspond with the cross sectional diagrams of FIGS. 15 to 19.

The gate wiring 1548 intersects, by interposing a gate insulating film that is not shown in the figure, with a semiconductor layer 1507 underneath. Though not shown, a source region, a drain region, and a Loff region which is formed from n⁻ region are formed in the semiconductor layer. Reference numeral 1563 denotes a contact section of the source wiring 1554 and the source region 1624; 1564, a contact section of the drain wiring 1558 and the drain region 1526; 1565, a contact section of the drain wiring 1558 and the pixel electrode 1561. Storage capacitor 1605 is formed in the region where a semiconductor layer 1627 extended from the drain region 1626 of the pixel TFT 1604 overlap capacitor wirings 1532 and 1549 by interposing a gate insulating film.

The p-channel TFT 1601 in the driving circuit has a channel forming region 1606, source regions 1607a and 1607b and drain regions 1608a and 1608b in the island semiconductor layer 1504. The first n-channel TFT 1602 has a channel forming region 1609, a LDD region 1610 overlapping the gate electrode 1529 (such a LDD region will hereinafter be referred to as Lov), a source region 1611 and a drain region 1612 in the island semiconductor layer 1505. The length in the channel direction of this Lov region is set to 0.5 to 3.0 μm, preferably 1.0 to 1.5 μm. A second n-channel TFT 1603 has a channel forming region 1613, LDD regions 1614 and 1615, a source region 1616 and a drain region 1617 in the island semiconductor layer 1506. In these LDD regions. there are formed an Lov region and a LDD region which does not overlap the gate electrode 1530(such an LDD region will hereafter be referred as Loff); and the length in the channel direction of this Loff region is 0.3 to 2.0 μm, preferably 0.5 to 1.5 μm.

The pixel TFT 1604 has channel forming regions 1618 and 1619, Loff regions 1620 to 1623, and source or drain regions 1624 to 1626 in the island semiconductor layer 1507. The length in the channel direction of the Loff regions is 0.5 to 3.0 μm, preferably 1.5 to 2.5 μm. Further, the storage capacitor 1605 comprises capacitor wirings 1532 and 1549, an insulating film composed of the same material as the gate insulating film, and a semiconductor layer 1627 which is connected to the drain region 1626 of the pixel TFT 1604 and in which an impurity element for imparting the n-type conductivity is added. It is not necessary to limit the present invention to the structure of the storage capacitor shown in the present Embodiment. For example, storage capacitors of the structures disclosed in Japanese Patent Application No. Hei 9-316567, Hei 9-273444 or 10-254097, of the present Applicant, can be used.

In FIG. 19, the pixel TFT 1604 is of the double gate structure, but may be of the single gate structure, or may be of a multi-gate structure in which a plurality of gate electrodes are provided.

Figure 21:
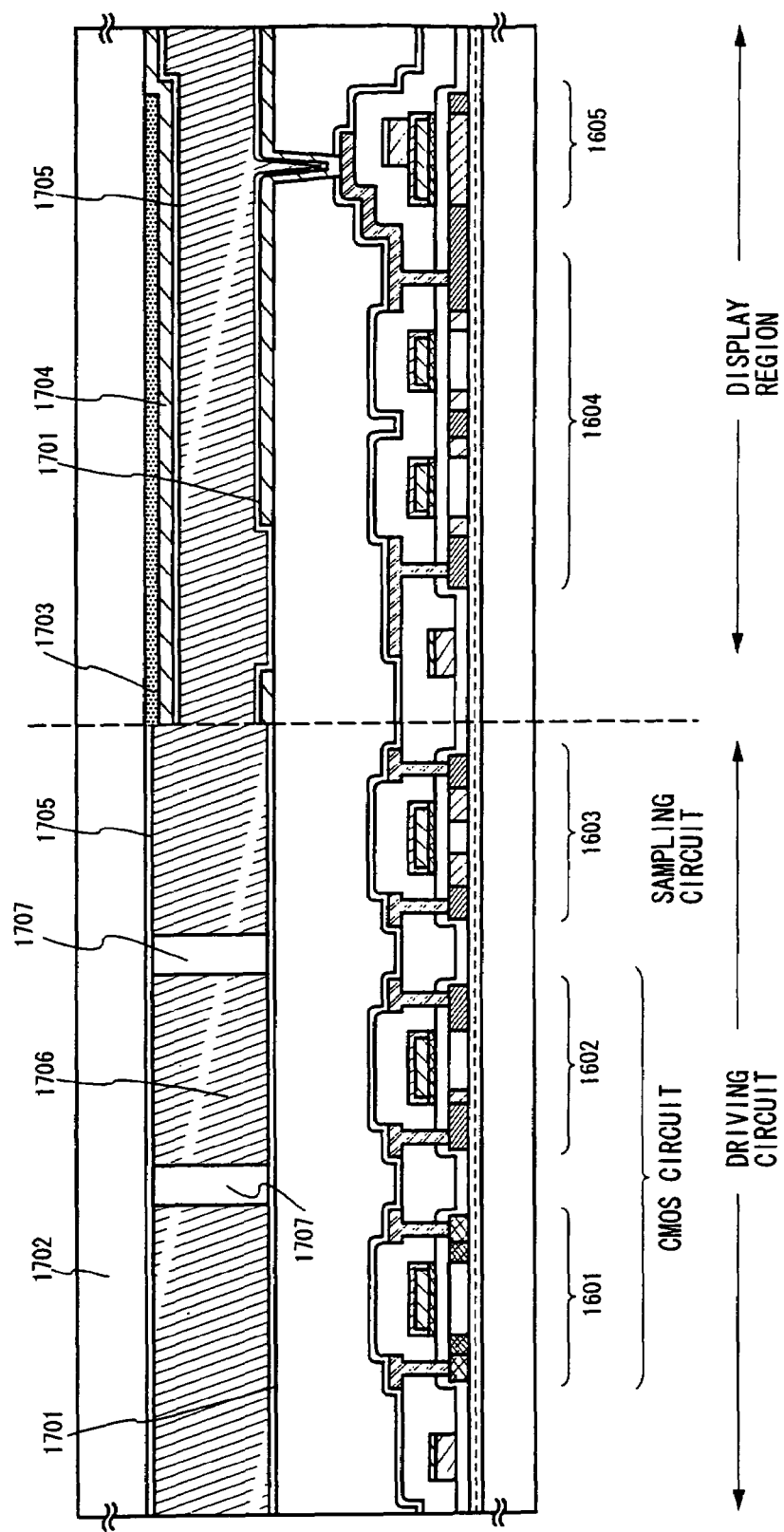
FIG. 21 is a diagram showing the sectional structure of a liquid crystal display device.

The processes for manufacturing an active matrix liquid crystal display device from the above stated active matrix substrate is described. As shown in FIG. 21, an alignment film 1701 is formed onto the active matrix substrate of the state of FIG. 19 manufactured through the above stated method. Polyimide resin is used in general for an alignment film of a liquid crystal display element. A shielding film 1703, a transparent conductive film 1704 and an alignment film 1705 are formed on the opposing substrate 1702 on the opposite side. After forming the alignment film, rubbing treatment is performed to make the liquid crystal molecules orient with a constant pre-tilt angle. The active matrix substrate formed with the pixel matrix circuit and the CMOS circuits, and the opposing substrate are stuck together by a sealant (not shown) or column spacers 1707 through a known cell assembly process. Liquid crystal material 1706 is then injected between the substrates and completely sealed by a sealant (not shown). Known liquid crystal materials can be used for the liquid crystal materials. An active matrix liquid crystal display device shown in FIG. 21 is thus complete.

As described above, an active matrix liquid crystal display device in which TFT structures that comprise each circuit are optimized in accordance with the specification required by the pixel TFT and the driver circuit, can be formed.

Note that any constitution of the Embodiments 1 to 7 may be used in manufacturing a semiconductor device shown in the present Embodiment, and it is possible to freely combine each Embodiments.

Embodiment 9

Referring to FIGS. 22A to 22C, an example of using another method of crystallization, substituting the crystallization step in Embodiment 8, is shown here in Embodiment 9.

First, the state of FIG. 22A is obtained in accordance with Embodiment 8. Note that FIG. 22A corresponds to FIG. 15A.

A metal element for promoting crystallization (one or plural kinds of elements selected from a group consisting of nickel, cobalt, germanium, tin, lead, palladium, iron, and copper, typically nickel) is used for performing crystallization. Specifically, laser crystallization is performed under a state in which the metal element is maintained in a surface of an amorphous silicon film to transform the amorphous silicon film into a crystalline silicon film. In Embodiment 9, an aqueous solution containing nickel (aqueous nickel acetate solution) is applied to the amorphous silicon film by spin coating to form a metal-element-containing layer 1801 on the entire surface of an amorphous semiconductor film 1503a. (FIG. 22B) The spin coating method is employed as a means of doping nickel in Embodiment 9. However, other methods such as evaporation and sputtering may be used for forming a thin film containing a metal element (nickel film in the case of Embodiment 9) on the amorphous semiconductor film.

Employing the method of irradiating a laser stated in Embodiment 1 of the present invention, a crystalline silicon film 1802 is formed next. (FIG. 22C)

By performing the rest of the process in accordance with the steps after FIG. 15C indicated in Embodiment 8, the structure shown in FIG. 21 can be attained If an island-like semiconductor layer is manufactured from the amorphous silicon film crystallized by using a metal element as in Embodiment 9, a very small amount of the metal element will remain in the island-like semiconductor film. Of course, it is still possible to complete a TFT under this state, but preferably better to remove at least the nickel element that will remain in a channel-forming region. As a means of removing the metal element residue, there is a method of utilizing a gettering action of phosphorous (P). A step in which phosphorous is selectively doped, heated, and gettered may be added. Nonetheless, without the addition of such step, the concentration of phosphorous (P) necessary for gettering is approximately the same level as the concentration in the impurity region ($n^+$) formed in FIG. 17B. Accordingly, by means of the heat treatment in the activation step shown in FIG. 17D, the metal element in the channel-forming region of the n-channel type TFT and the p-channel type TFT can be gettered removed therefrom.

There are other means for removing the metal element without being particularly limited. For example, after forming the island-shape semiconductor layer, heat treatment is performed on the crystalline semiconductor film with a metal element residue at a temperature between 800° C. and 1150° C. (preferably between 900° C. and 1000° C.) for 10 minutes to 4 hours (preferably between 30 minutes and 1 hour) in an oxygen atmosphere to which 3 to 10 volume % of hydrogen chloride is contained. Through this step, the nickel in the crystalline semiconductor film becomes a volatile chloride compound (nickel chloride) and is eliminated in the treatment atmosphere during the operation. In other words, it is possible to remove nickel by the gettering action of a halogen element.

A plural number of means may be used in combination to remove the metal element. Also, gettering may be performed prior to the formation of the island-like semiconductor layer.

Embodiment 10

Referring to FIGS. 23A to 23D, an example of using another method of crystallization, substituting the crystallization step in Embodiment 8, is shown here in Embodiment 10.

First, the state of FIG. 23A is obtained in accordance with Embodiment 8. Note that FIG. 23A corresponds to FIG. 15A.

First, an aqueous solution containing a metal element (nickel, in this Embodiment) (aqueous nickel acetate solution) is applied to an amorphous silicon film by spin coating to form a metal-element-containing layer 1902 on the entire surface of an amorphous semiconductor film 1503a. (FIG. 23 B) Possible metal elements other than nickel (Ni) that can be used here are elements such as germanium (Ge), iron (Fe), palladium (Pd), tin (Sn), lead (Pb), cobalt (Co), platinum (Pt), copper (Cu), and gold (Au).

The spin coating method is employed as a means of doping nickel in Embodiment 10. However, other methods such as evaporation and sputtering may be used for forming a thin film made of a metal element (nickel film in the case of Embodiment 10) on the amorphous semiconductor film. Though the example of forming the metal-element-containing layer 1902 on the entire surface of the amorphous semiconductor film 1503a is shown here in Embodiment 10, a mask may be formed to selectively form the metal-element-containing layer.

Heat treatment is performed next at a temperature between 500° C. and 650° C. (preferably between 550° C. and 600° C.) for a duration of 6 hours to 16 hours (preferably between 8 and 14 hours). Consequently, crystallization is advanced and a crystalline semiconductor film (crystalline silicon film in Embodiment 10) 1902 is formed. (FIG. 23 C) In the case of selectively forming the metal-element-containing layer, with an opening of the mask as the starting point, crystallization advances in the direction substantially parallel (the direction indicated by an arrow) with the substrate. A crystalline silicon film that has uniform (even) crystal growth direction when viewed macroscopically is thus formed.

There are many defects included in the crystalline silicon film crystallized by the above method due to the low crystallization temperature, and there are cases in which it is insufficient for use as a semiconductor element material. Thus, in order to increase the crystallinity of the crystalline silicon film, the film is irradiated with a laser using the laser irradiation method indicated in Embodiment 2. A crystalline silicon film 1903 having good crystallinity is thus formed. (FIG. 23 D)

By performing the rest of the process in accordance with the steps after FIG. 15C indicated in Embodiment 8, the structure shown in FIG. 21 can be attained.

Note that similar to Embodiment 9, it is further preferable to remove the metal element that will remain at least from the channel-forming region. Accordingly, it is also desirable that gettering be performed by using the method indicated in Embodiment 8.

Embodiment 11

Figure 24:
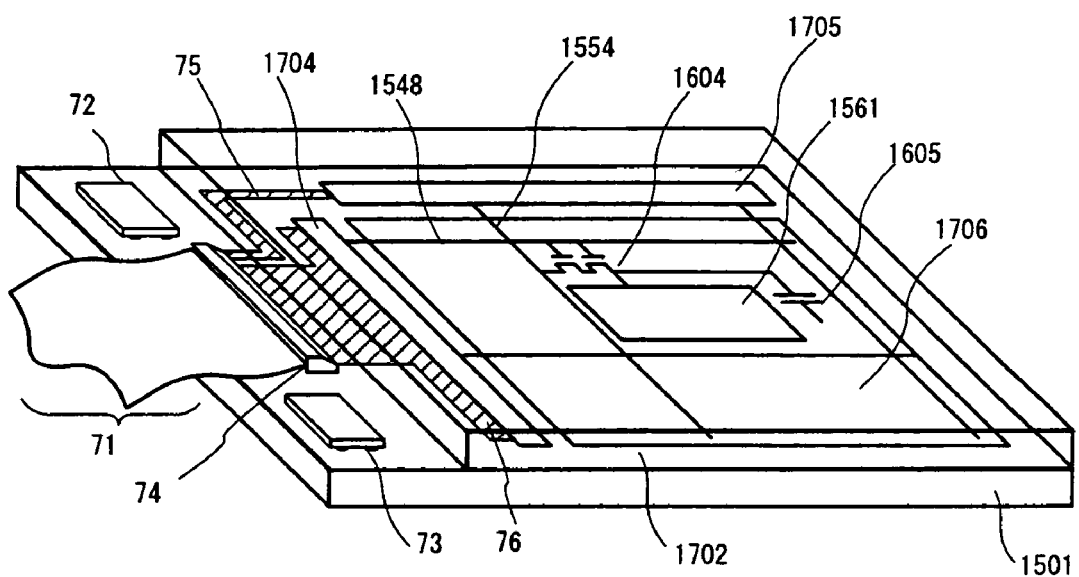
FIG. 24 is a diagram showing an external view of an AM-LCD.

The structure of an active matrix type liquid crystal display device indicated in Embodiment 8 is explained using the perspective view of FIG. 24. Note that in order to give correspondence with the diagrams of FIGS. 15A to 20, common symbols are used for FIG. 24.

In FIG. 24, an active matrix substrate is structured by of a display region 1706, a scanning signal drive circuit 1704, and an image signal drive circuit 1705 formed on a glass substrate 1501. A pixel TFT 1604 is provided in the display region, and the drive circuits formed in the periphery thereof are structured with CMOS circuit as a base. The scanning signal drive circuit 1704 and the image signal drive circuit 1705 are connected to the pixel TFT 1604 by a gate wiring 1531 and a source wiring 1554, respectively. Further, an FPC71 is connected to an external input terminal 74, and is connected via input wirings 75 and 76 to the respective drive circuits. Reference symbol 1702 denotes an opposing substrate 1702.

Embodiment 12

It is also possible to apply the present invention to active matrix EL displays. An example is shown in FIG. 25.

Figure 25:
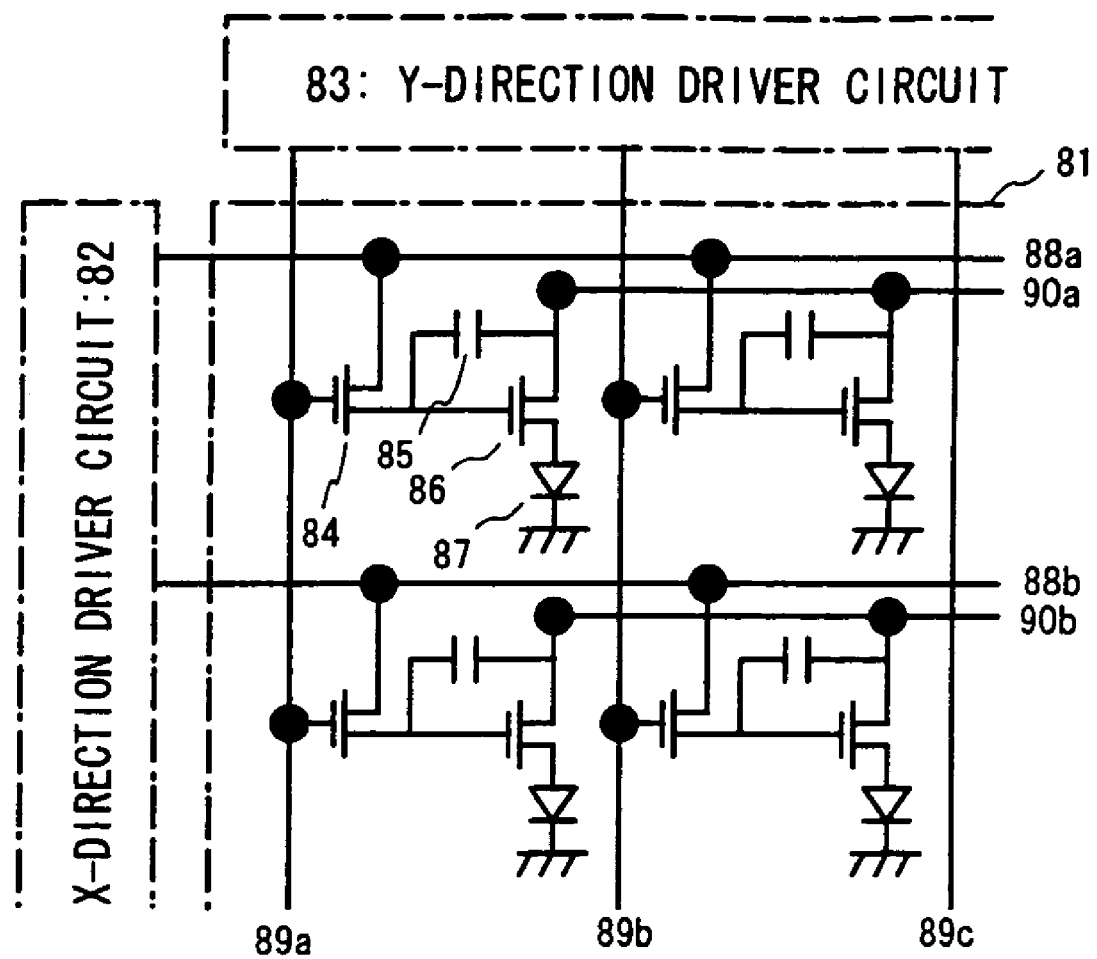
FIG. 25 is a diagram showing the structure of an active matrix type EL display device.

FIG. 25 is a circuit diagram of an active matrix EL display. Reference numeral 81 denotes a display region and a X-direction driver circuit 82 and a Y-direction driver circuit 83 are disposed in its peripheral. Each pixel of the display region 81 has a switching TFT 84, a storage capacitor 85, a current control TFT 86 and an organic EL element 87; the switching TFT 84 is connected to a X-direction signal line 88a (or 88b) and Y-direction signal line 89a (or 89b). Further, power supply lines 90a and 90b are connected to the current control TFT 86.

In the active matrix EL displays of the present Embodiment, TFTs used in the X-direction driver circuit 82 and the Y-direction driver circuit 83 are formed by combining the p-channel TFT 1601, the n-channel TFTs 1602 and 1603 of FIG. 19 shown in the Embodiment 8. Further, TFTs of the switching TFT 84 and the current control TFT 86 are formed from the n-channel TFT 1604 of FIG. 19.

Embodiment 13

The present invention may be applied to all conventional IC techniques. That is, it is applicable to all semiconductor circuits now in circulation in the markets. For example, the present invention may be applied to a microprocessor integrated on one chip, such as a RISC processor, a ASIC processor, or a signal processing circuit, typically a driver circuit for liquid crystals (such as a D/A converter, a γ correction circuit, a signal dividing circuit), and high frequency circuits for mobile equipment (portable phone, PHS, mobile computer).

Further, a semiconductor circuit such as a microprocessor is mounted in various kinds of electronic equipment functioning as central circuit. As typical electronic equipment, a personal computer, a portable information terminal, or other household appliances may be enumerated. Additionally, a computer for controlling vehicles (an automobile, a train, and so forth) may be given. The present invention is applicable to these types of semiconductor devices.

Any of the constitutions of Embodiments 8 through 12 may be adopted for manufacturing the semiconductor device indicated in Embodiment 13, or the constitutions of the respective embodiments may be freely combined.

Embodiment 14

The TFTs formed by implementing the present invention can be used in various electro-optical devices. Namely the present invention can be implemented on all of the electronic appliances that incorporate these electro-optical devices as a display. The following can be given as examples of this type of electronic appliances: video cameras; digital cameras; head mounted displays (goggle type displays); wearable displays; car navigation systems; personal computers; portable information terminals (such as mobile computers, portable telephones and electronic notebooks). Some examples of these are shown in FIGS. 26A to 26F.

FIG. 26A is a personal computer, which comprises: a main body 2001; an image input section 2002; a display section 2003; and a keyboard 2004. The present invention can be applied to the image input section 2002, display section 2003 or other driver circuits.

FIG. 26B is a video camera, which comprises: a main body 2101; a display section 2102; a voice input section 2103; operation switches 2104; a battery 2105; and an image receiving section 2106. The present invention can be applied to the display section 2102, the voice input section 2103 or other driver circuits.

FIG. 26C is a mobile computer which comprises: a main body 2201; a camera section 2202; an image receiving section 2203; operation switches 2204; and a display section 2205. The present invention can be applied to the display section 2205 or other driver circuits.

FIG. 26D is a goggle type display which comprises: a main body 2301; a display section 2302; and an arm section 2303. The present invention can be used for the display section 2302 or other driver circuits.

FIG. 26E is a player that uses a recording medium on which a program is recorded (hereinafter referred to as a recording medium), which comprises: a main body 2401; a display section 2402; a speaker section 2403; a recording medium 2404; and operation switches 2405 etc. Note that music appreciation, film appreciation, games, and the use of the Internet can be performed with this device using a DVD (digital versatile disk), a CD, etc., as a recording medium. The present invention can be applied to the display sections 2402 or other driver circuits.

FIG. 26F is a digital camera which comprises: a main body 2501; a display section 2502; a view finder section 2503; operation switches 2504; and an image receiving section (not shown in the figure). The present invention can be applied to the display section 2502 or other driver circuits.

As described above, the applicable range of the present invention is very large, and it is possible to apply to electronic appliances of various areas. Further, the electric appliances of the present embodiment can be realized by any constitution of combination of Embodiments 8 to 13.

Embodiment 15

The TFTs formed by implementing the present invention can be used in various electro-optical devices. Namely the present invention can be implemented on all of the electronic appliances that incorporate these electro-optical devices as a display.

Projectors (rear type or front type) can be given as such electronic appliances. The examples are shown in FIGS. 27A to 27D.

Figure 27A:
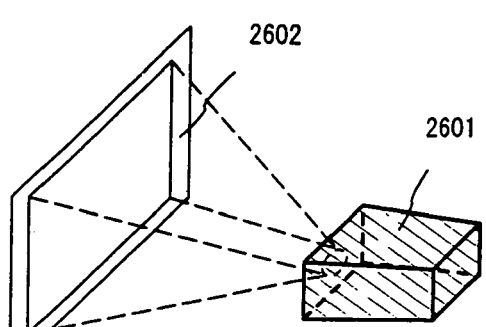
FIGS. 27A to 27D are diagrams showing examples of electronic equipment.

FIG. 27A is a front projector which comprises a projection device 2601 and a screen 2602. The present invention can be applied to the liquid crystal display device that constitutes a part of the projection device or other driver circuits.

Figure 27B:
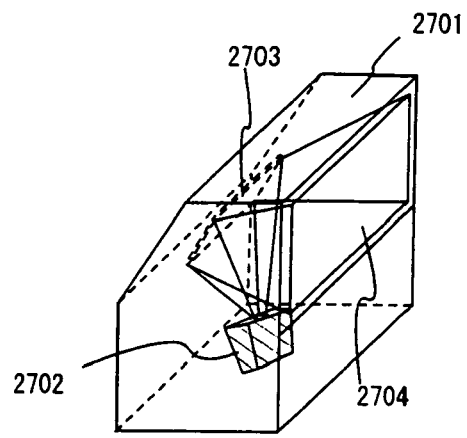

FIG. 27B is a rear projector which comprises: a main body 2701, a projection device 2702, a mirror 2703 and a screen 2407. The present invention can be applied to the liquid crystal display device that constitutes a part of the projection device or other driver circuits.

Figure 27C:
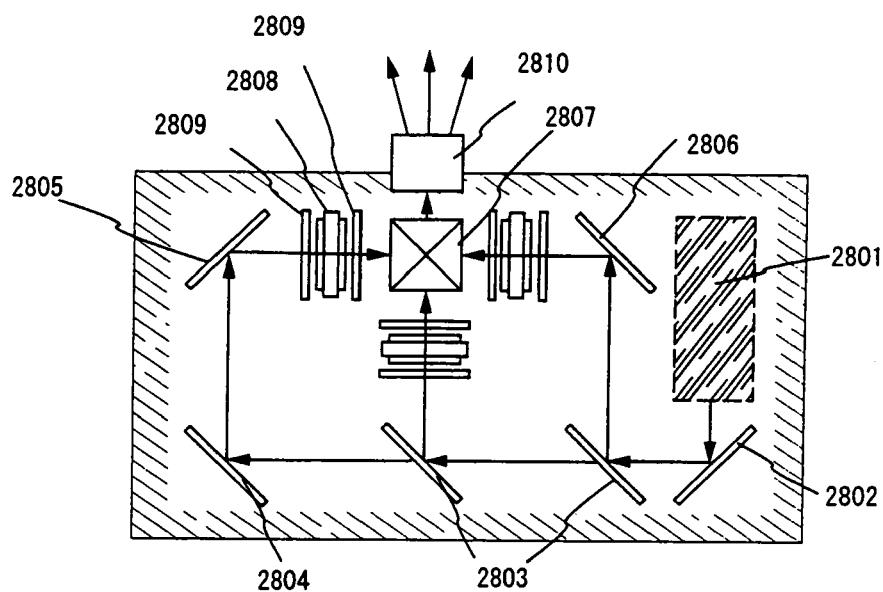

FIG. 27C is a diagram showing an example of the structure of the projection devices 2601 and 2702 in FIGS. 27A and 27B. The projection devices 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system including projection lens. Though the present embodiment shows an example of 3-plate type, it is not limited to the 3-plate type, for example, single plate type is appropriate. Further, an operator may properly dispose an optical lens, a film having light polarizing function, a film adjusting phase difference, IR films and so forth in the optical path shown by an arrow in FIG. 27C.

Figure 27D:
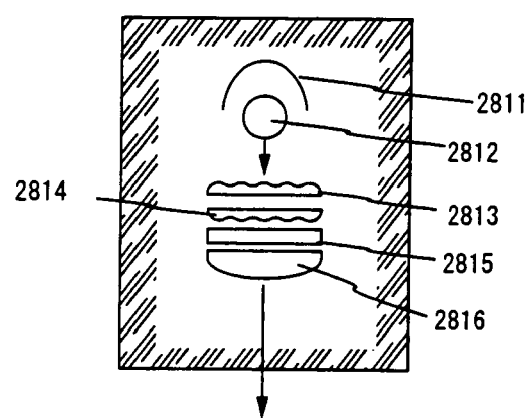

FIG. 27D is a diagram showing an example of the structure of the optical light source system 2801 in FIG. 27C. In the present embodiment the optical light source system 2801 comprises: a reflector 2811; a light source 2812, 2813 and 2814; light polarizing conversion element 2815; and a condenser lens 2816. Note that the optical light source system shown in FIG. 27D is merely an example and the structure is not specifically limited. For example, an operator may properly dispose an optical lens, a film having light polarizing function, a film adjusting phase difference, IR films and so forth in the optical light source system.

As described above, the applicable range of the present invention is very large, and it is possible to apply to electronic appliances of various areas. Further, the electric appliances of the present embodiment can be realized by any combination of the constitutions of Embodiments 8 to 11.

A crystalline semiconductor film having an average grain size of approximately 500 nm or more, between 1 and 3 μm, may be formed with employment of the laser irradiation apparatus and the method of irradiating a laser according to the present invention.

What is claimed is:

1. A method for manufacturing a semiconductor device comprising:
   forming a semiconductor film over a substrate;
   emitting a laser beam from a laser oscillator;
   splitting the laser beam into a first laser beam and a second laser beam; and
   irradiating a top surface of the semiconductor film with a light emitted from a lamp while irradiating the top surface of the semiconductor film with the first laser beam and a back surface of the semiconductor film with the second laser beam.

2. A method for manufacturing a semiconductor device according to claim 1, wherein the light comprises an infrared light.

3. A method for manufacturing a semiconductor device according to claim 1, wherein the first laser beam and the second laser beam comprise XeCl excimer laser beams.

4. A method for manufacturing a semiconductor device according to claim 1, wherein the irradiating step is conducted in an atmosphere selected from the group consisting of $H_2$, He, $N_2$, Ar, and a gaseous mixture thereof.

5. A method for manufacturing a semiconductor device according to claim 1, wherein the second laser beam has a wider width than the first laser beam on an irradiation surface.

6. A method for manufacturing a semiconductor device according to claim 1,
   wherein an irradiated part of the semiconductor film is moved by cylindrical shape rollers.

7. A method for manufacturing a semiconductor device comprising:

forming a semiconductor film over a substrate;

emitting a laser beam from a laser oscillator;

splitting the laser beam into a first laser beam and a second laser beam; and irradiating a top surface of the semiconductor film with a light emitted from a lamp while irradiating the top surface of the semiconductor film with the first laser beam and a back surface of the semiconductor film with the second laser beam, wherein the first laser beam and the second laser beam are elongated in one direction on an irradiation surface.

8. A method for manufacturing a semiconductor device according to claim 7, wherein the light comprises an infrared light.

9. A method for manufacturing a semiconductor device according to claim 7, wherein the first laser beam and the second laser beam comprise XeCl excimer laser beams.

10. A method for manufacturing a semiconductor device according to claim 7, wherein the irradiating step is conducted in an atmosphere selected from the group consisting of $H_2$, He, $N_2$, Ar, and a gaseous mixture thereof.

11. A method for manufacturing a semiconductor device according to claim 7, wherein the second laser beam has a wider width than the first laser beam on an irradiation surface.

12. A method for manufacturing a semiconductor device according to claim 7, wherein an irradiated part of the semiconductor film is moved by cylindrical shape rollers.

13. A method for manufacturing a semiconductor device comprising:

forming a semiconductor film over a substrate;

emitting a laser beam from a laser oscillator;

splitting the laser beam into a first laser beam and a second laser beam; and irradiating a top surface of the semiconductor film with a light emitted from at least two lamps while irradiating the top surface of the semiconductor film with the first laser beam and a back surface of the semiconductor film with the second laser beam.

14. A method for manufacturing a semiconductor device according to claim 13, wherein the light comprises an infrared light.

15. A method for manufacturing a semiconductor device according to claim 13, wherein the first laser beam and the second laser beam comprise XeCl excimer laser beams.

16. A method for manufacturing a semiconductor device according to claim 13, wherein the irradiating step is conducted in an atmosphere selected from the group consisting of $H_2$, He, $N_2$, Ar, and a gaseous mixture thereof.

17. A method for manufacturing a semiconductor device according to claim 13, wherein the second laser beam has a wider width than the first laser beam on an irradiation surface.

18. A method for manufacturing a semiconductor device according to claim 13, wherein an irradiated part of the semiconductor film is moved by cylindrical shape rollers.

\* \* \* \* \*